(12) United States Patent
Song et al.

(10) Patent No.: US 12,745,458 B2
(45) Date of Patent: Sep. 22, 2026

(54) DISPLAY DEVICE INCLUDING A LIGHT EMITTING ELEMENT CONNECTED TO A FIRST PAD ELECTRODE AND A SECOND PAD ELECTRODE AND MANUFACTURING METHOD THEREOF

(71) Applicant: Samsung Display Co., LTD., Yongin-si (KR)

(72) Inventors: Dae Ho Song, Yongin-si (KR); Min Woo Kim, Yongin-si (KR); Sung Kook Park, Yongin-si (KR); Byung Choon Yang, Yongin-si (KR); So Yeon Yoon, Yongin-si (KR); Hyung Il Jeon, Yongin-si (KR); Joo Woan Cho, Yongin-si (KR); Jin Woo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 793 days.

(21) Appl. No.: 17/697,720

(22) Filed: Mar. 17, 2022

(65) Prior Publication Data

US 2022/0328436 A1 Oct. 13, 2022

(30) Foreign Application Priority Data

Apr. 7, 2021 (KR) ........................ 10-2021-0045461

(51) Int. Cl.
*H01L 23/00* (2006.01)
*H01L 25/16* (2023.01)
(Continued)

(52) U.S. Cl.
CPC ......... *H10D 86/441* (2025.01); *H10D 86/021* (2025.01); *H10D 86/60* (2025.01);
(Continued)

(58) Field of Classification Search
CPC ......... H01L 24/05; H01L 24/06; H01L 24/13; H01L 24/14; H01L 24/16; H01L 24/81;
(Continued)

(56) References Cited

U.S. PATENT DOCUMENTS 8,493,543 B2 7/2013 Ota
9,343,448 B2 5/2016 Sakariya et al.
(Continued)

FOREIGN PATENT DOCUMENTS

CN 101726895 A 6/2010
CN 110970537 A 4/2020
(Continued)

*Primary Examiner* — Duy T Nguyen
*Assistant Examiner* — Jiyoung Oh
(74) *Attorney, Agent, or Firm* — Womble Bond Dickinson (US) LLP

(57) ABSTRACT

A display device may include: a substrate including a display area and a non-display area; and a pixel located in the display area, the pixel having an emission area and a pixel circuit area. The pixel may include: at least one transistor located in the pixel circuit area; a first pad electrode and a second pad electrode spaced from each other and located in the emission area, the first pad electrode and the second pad electrode being electrically connected to the at least one transistor; a first through hole penetrating one region of the first pad electrode; a second through hole penetrating one region of the second pad electrode; and a light emitting element located in the emission area, the light emitting element being electrically connected to the first pad electrode and the second pad electrode.

19 Claims, 28 Drawing Sheets

(51) Int. Cl.

| | |
|---|---|
| ***H10D 86/01*** | (2026.01) |
| ***H10D 86/40*** | (2025.01) |
| ***H10D 86/60*** | (2025.01) |
| ***H10W 90/00*** | (2026.01) |
| *H10W 72/00* | (2026.01) |
| *H10W 72/20* | (2026.01) |
| *H10W 72/29* | (2026.01) |
| *H10W 72/90* | (2026.01) |

(52) U.S. Cl.

CPC ...... *H10W 90/00* (2026.01); *H10W 72/07231* (2026.01); *H10W 72/07232* (2026.01); *H10W 72/07236* (2026.01); *H10W 72/221* (2026.01); *H10W 72/227* (2026.01); *H10W 72/242* (2026.01); *H10W 72/29* (2026.01); *H10W 72/923* (2026.01); *H10W 72/926* (2026.01); *H10W 72/931* (2026.01); *H10W 72/934* (2026.01); *H10W 72/942* (2026.01); *H10W 90/722* (2026.01)

(58) Field of Classification Search

CPC . H01L 25/167; H01L 25/0753; H01L 27/124; H01L 27/156; H01L 27/1255; H01L 27/1248; H01L 27/1259; H01L 33/0093; H01L 2224/0401; H01L 2224/1403; H01L 2224/05011; H01L 2224/05551; H01L 2224/0558; H01L 2224/05564; H01L 2224/0603; H01L 2224/8181; H01L 2224/13007; H01L 2224/13023; H01L 2224/16112; H01L 2224/16147; H01L 2224/81005; H01L 2224/81203; H01L 2224/81908

USPC ........................................................... 257/72

See application file for complete search history.

(56) References Cited

U.S. PATENT DOCUMENTS

| | | | | |
|---|---|---|---|---|
| 10,181,507 | B2 | 1/2019 | Bower et al. | |
| 11,251,235 | B2 | 2/2022 | Yoon et al. | |
| 2008/0064232 | A1 | 3/2008 | Reiss et al. | |
| 2020/0013766 | A1* | 1/2020 | Kim | H01L 25/167 |
| 2020/0066952 | A1* | 2/2020 | Hussell | H10H 20/857 |
| 2020/0105195 | A1* | 4/2020 | Song | G09G 3/3241 |
| 2020/0119244 | A1* | 4/2020 | Kwon | G09G 3/32 |
| 2020/0176526 | A1* | 6/2020 | Yoon | H10K 59/1216 |
| 2020/0227603 | A1* | 7/2020 | Pun | H10H 20/8506 |
| 2021/0193954 | A1* | 6/2021 | Shin | H10K 59/131 |
| 2021/0391309 | A1* | 12/2021 | Kim | H10W 90/00 |

FOREIGN PATENT DOCUMENTS

| | | | | | |
|---|---|---|---|---|---|
| CN | 111261043 | A | | 6/2020 | |
| CN | 111463233 | A | * | 7/2020 | H10H 20/831 |
| KR | 10-2017-0099451 | A | | 9/2017 | |
| KR | 10-1973855 | B1 | | 8/2019 | |

* cited by examiner

FIG. 1

DD
DD_DA
DD_NDA
DR3
DR2
DR1

PSV2
PSV1
ILD
BFL
SF1
SUB
SF2
I'
I
Dj
CH
BML
ILD
GI
DE2
GE2
(Si)
ACT2
SE2
T2(T)
Cst
STE1
(PL2)
STE2
(CP)
CNL2
CNL1
DE1
ACT1
GE1
SE1
T1(T)
CNT1
PDE1
CNT2
PL1
PDE2
TH1
TH2
NEMA(PXCA)
PXA
EMA
PCL
DR1
DR2
DR3

Figure 11:
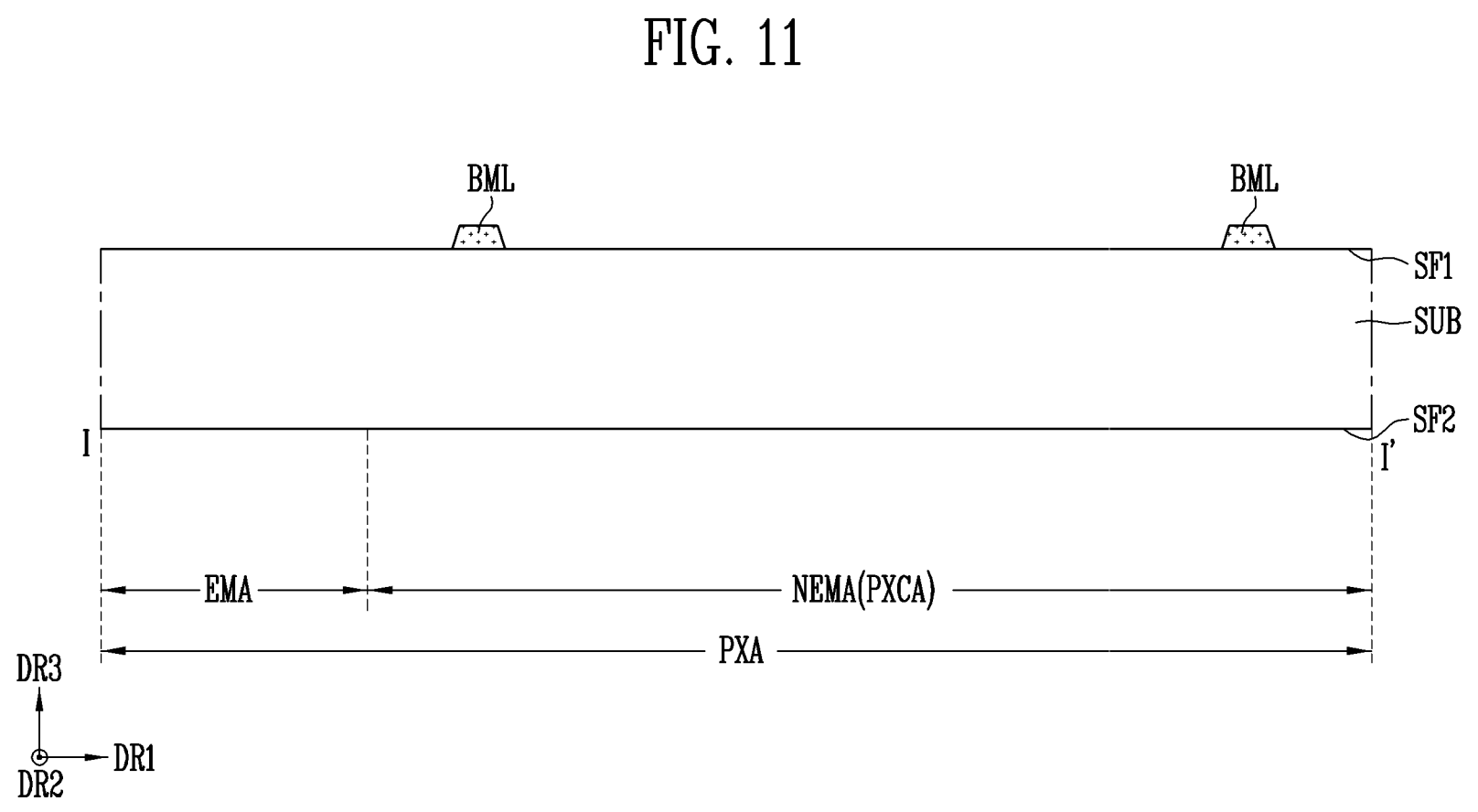

SF1
SUB
SF2
I'
BML
BML
NEMA(PXCA)
PXA
EMA
I
DR1
DR2
DR3

BFL
SF1
SUB
SF2
I'
BML
BML
NEMA(PXCA)
PXA
EMA
I
DR1
DR2
DR3

FIG. 13

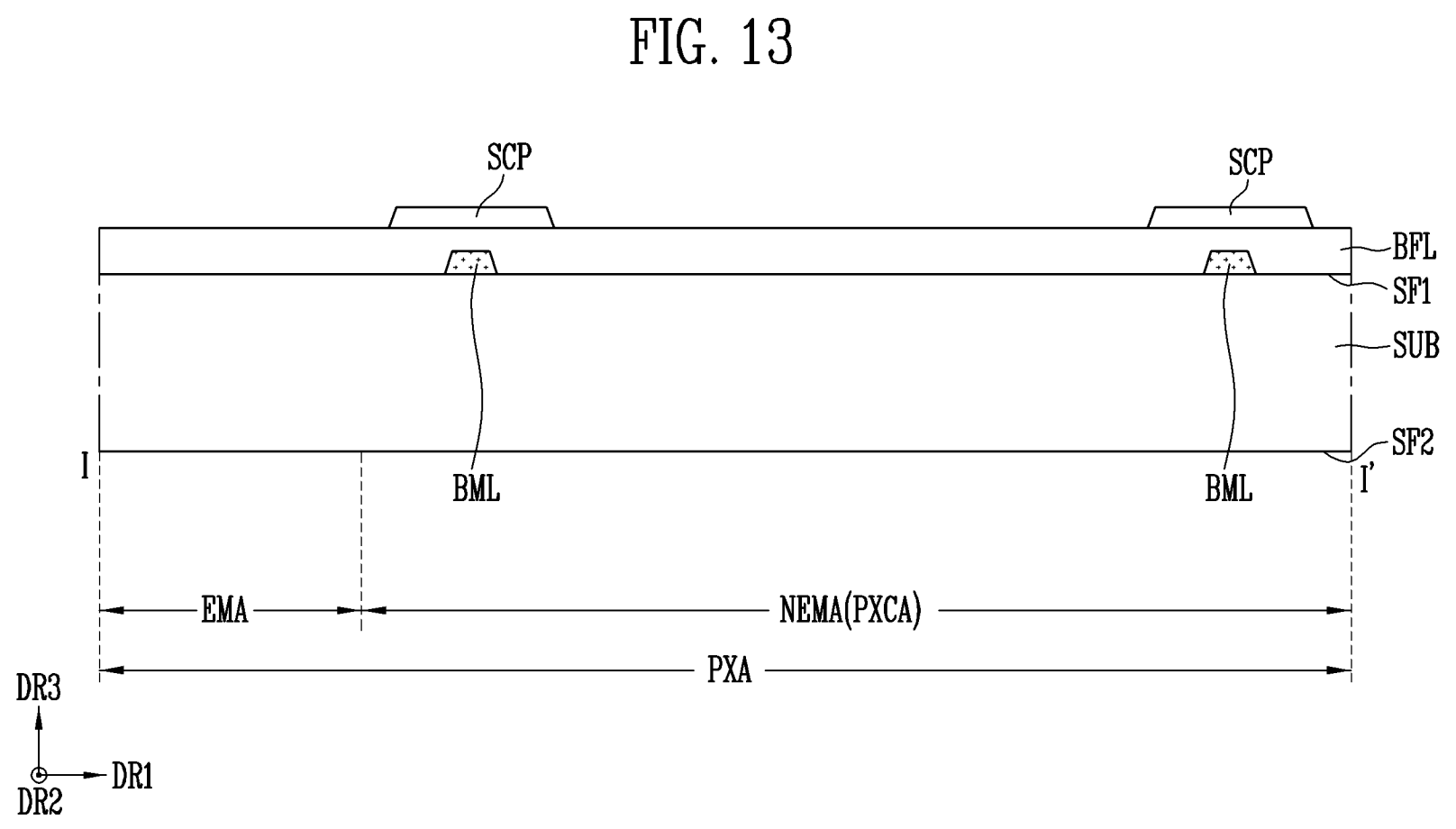

BFL
SF1
SUB
SF2
I'
SCP
BML
SCP
BML
NEMA(PXCA)
PXA
EMA
I
DR1
DR2
DR3

FIG. 14

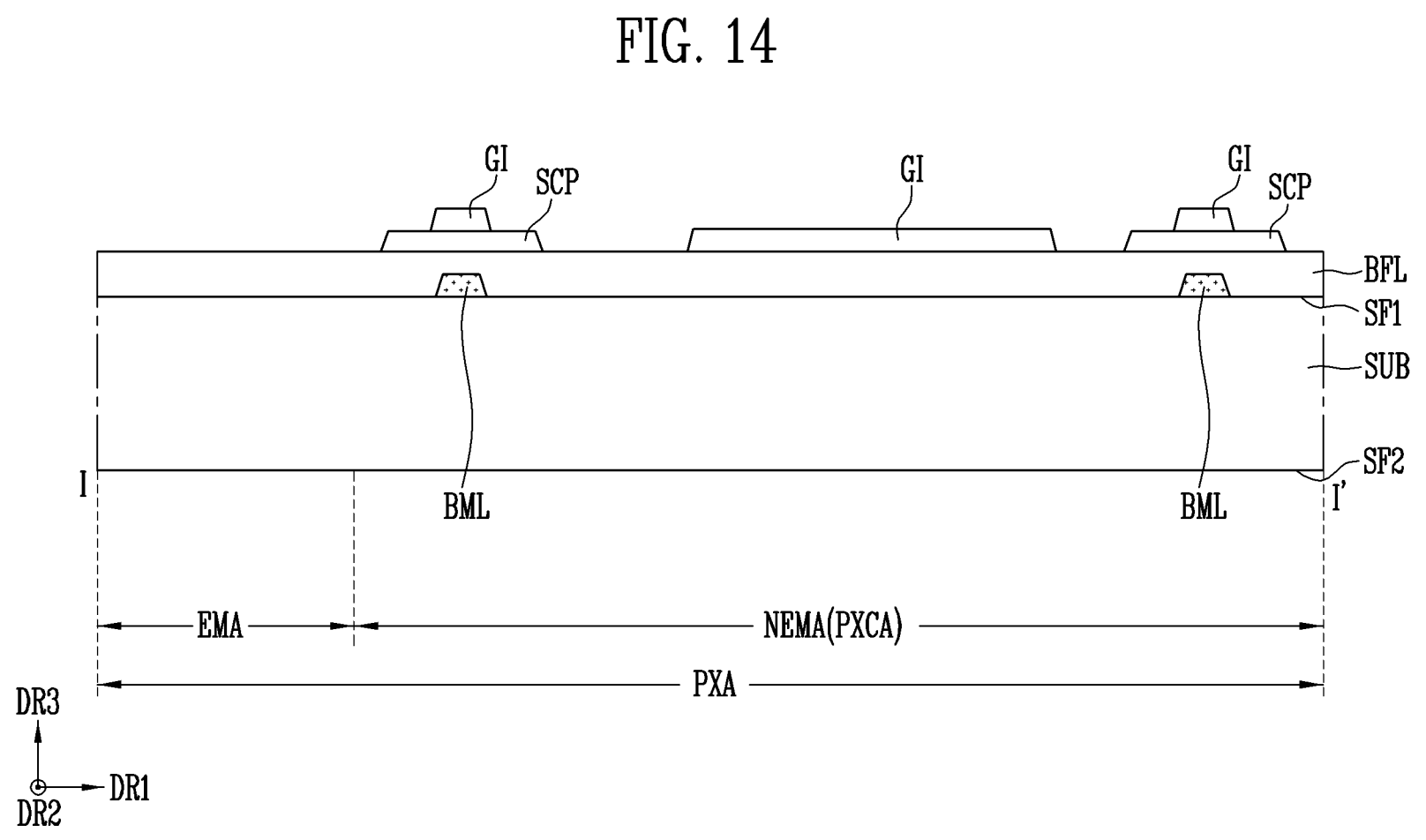

BFL SF1 SUB SF2 I'
SCP
GI
BML
GI
NEMA(PXCA)
PXA
SCP
GI
BML
EMA
I
DR1
DR3
DR2

FIG. 15

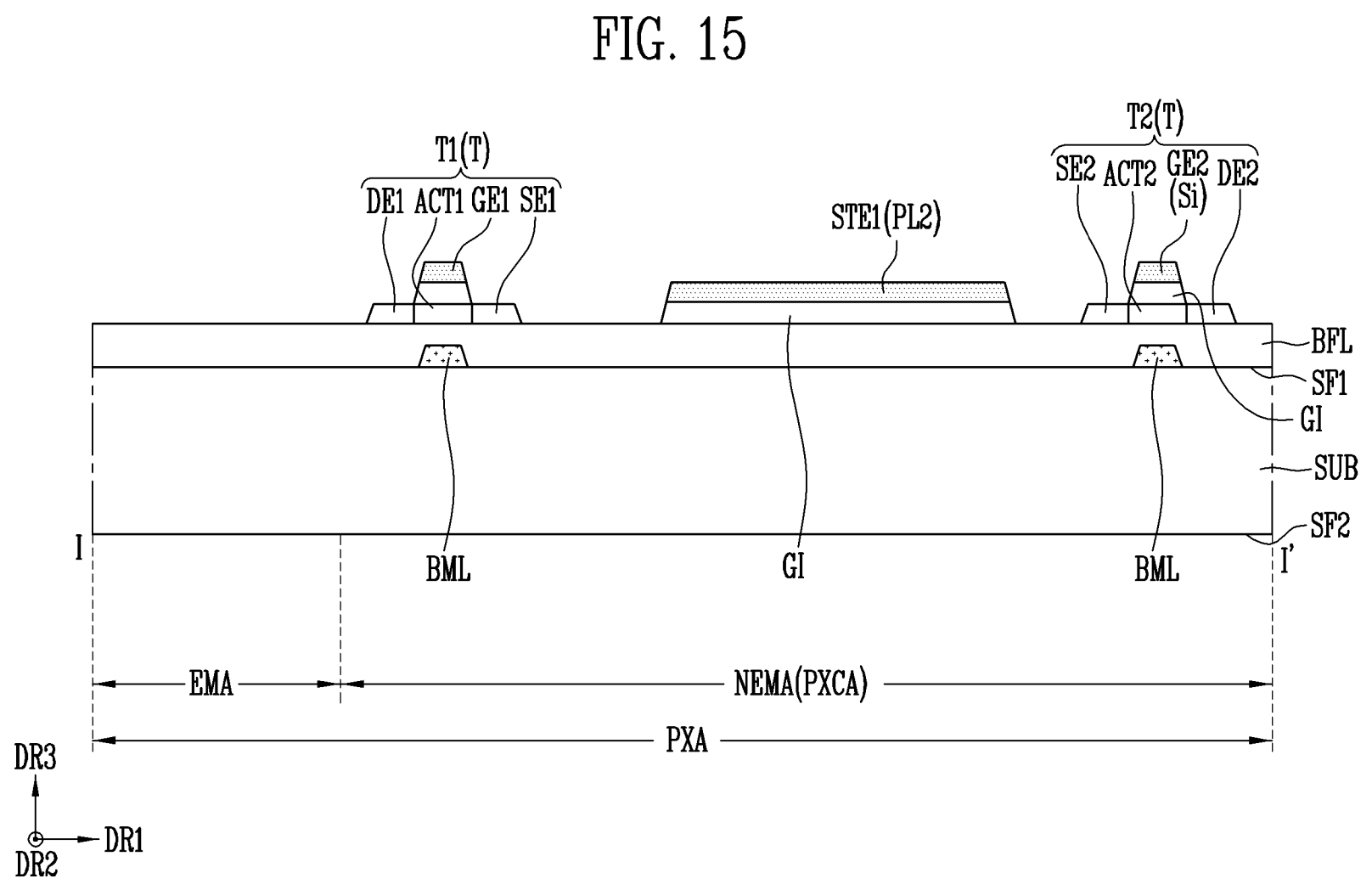

BFL
SF1
GI
SUB
SF2
I'
T2(T)
SE2 ACT2 GE2 DE2
(Si)
BML
STE1(PL2)
GI
NEMA(PXCA)
PXA
T1(T)
DE1 ACT1 GE1 SE1
BML
EMA
I
DR1
DR3
DR2

Figure 16:
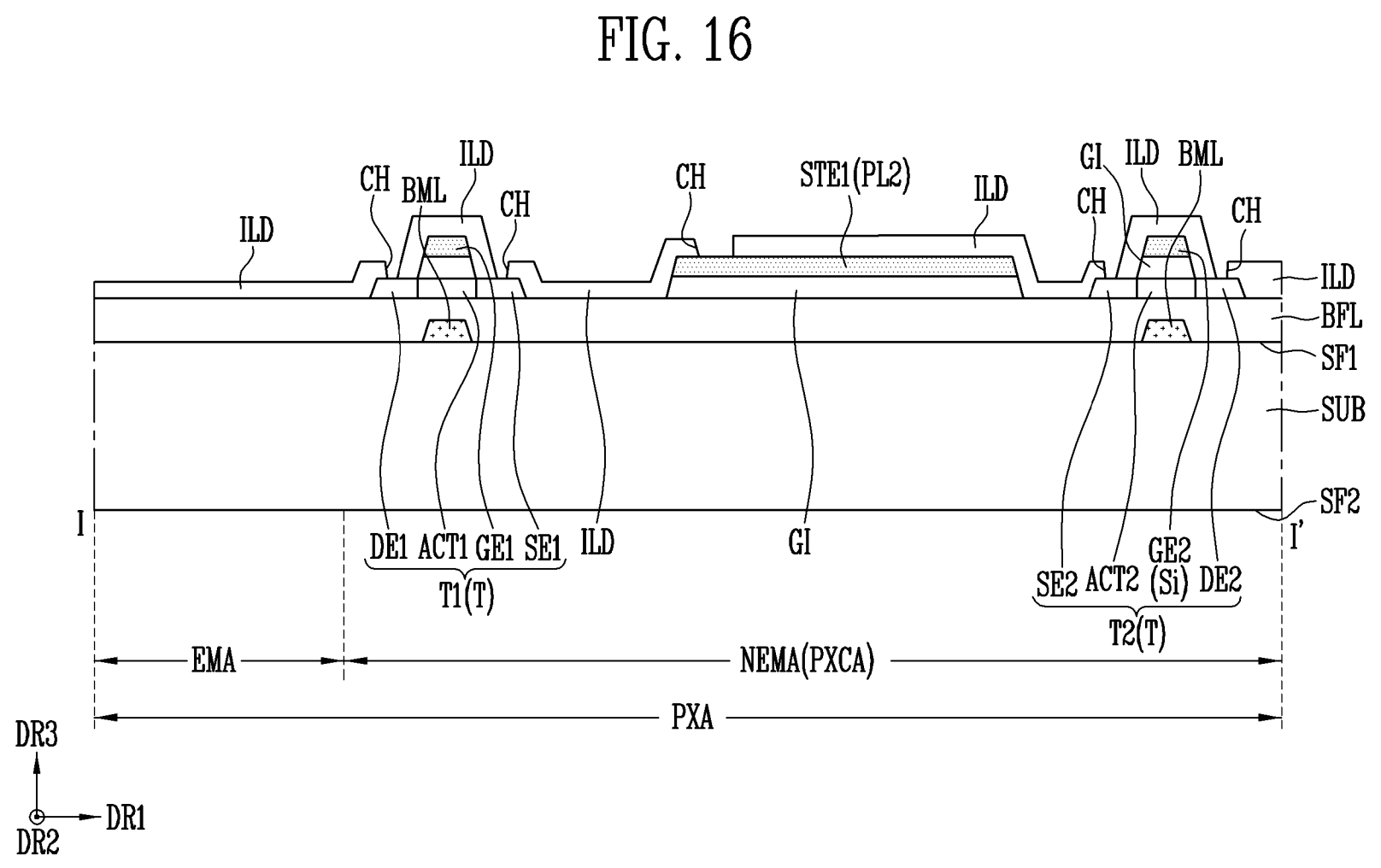

Figure 17:
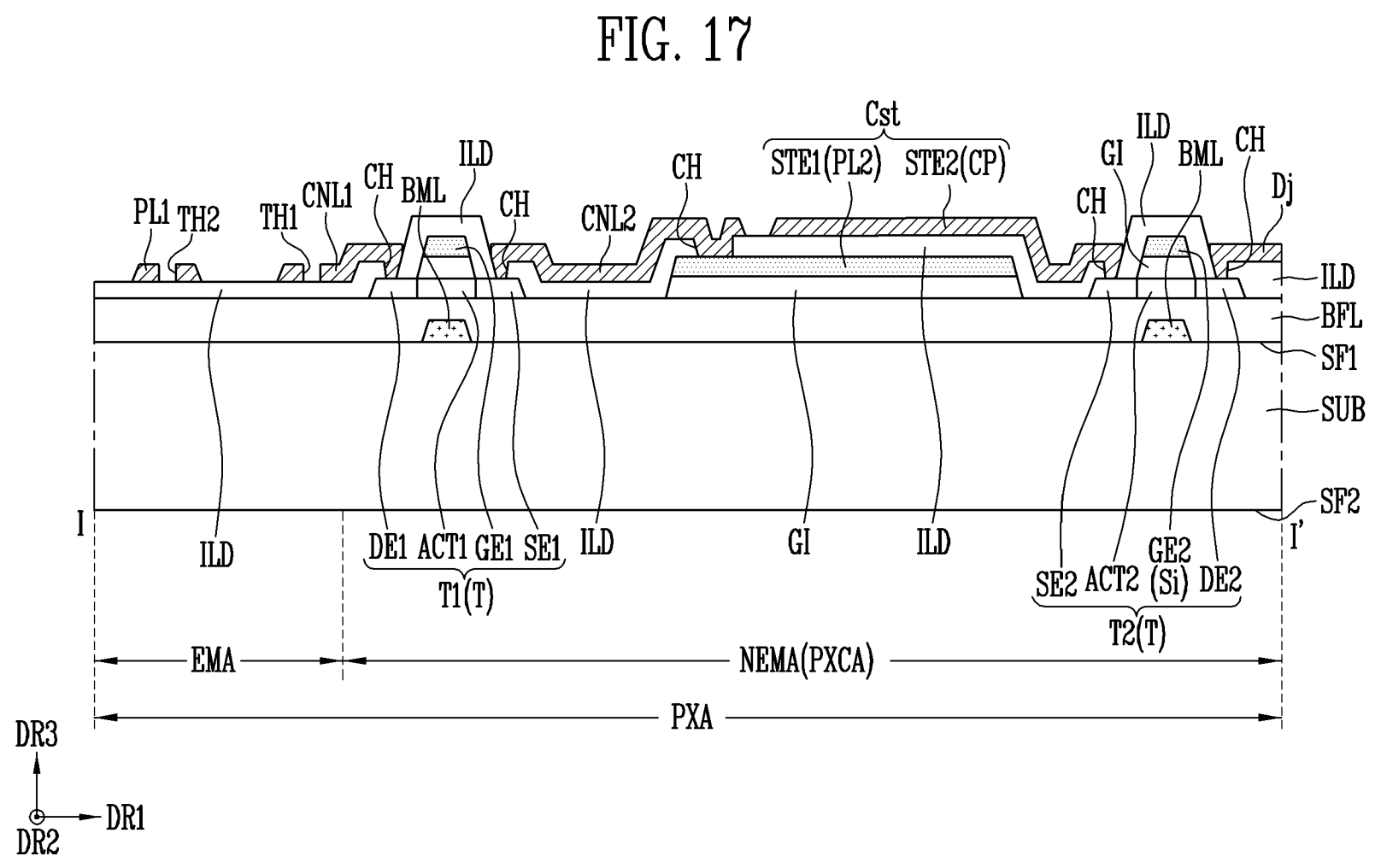

ILD BFL SF1 SUB SF2 I'
Dj CH BML ILD GI CH
DE2 GE2 (Si) ACT2 SE2 T2(T)
Cst STE1(PL2) STE2(CP)
ILD GI
CH CNL2 ILD
CH ILD BML CH CNL1 TH1
SE1 GE1 ACT1 DE1 T1(T)
PL1 TH2 ILD
NEMA(PXCA) EMA PXA
I
DR1 DR2 DR3

Figure 18:
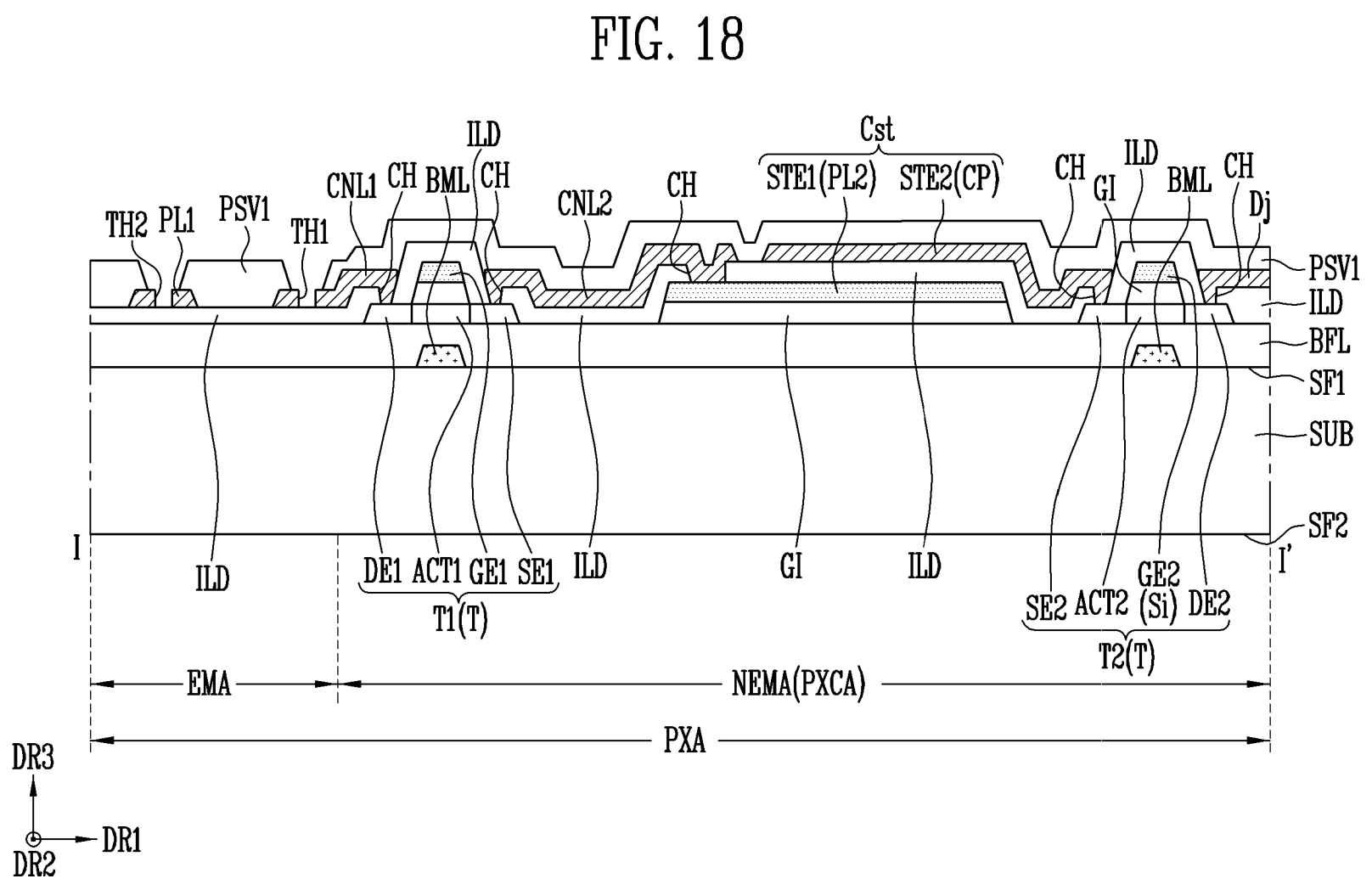

Figure 19:
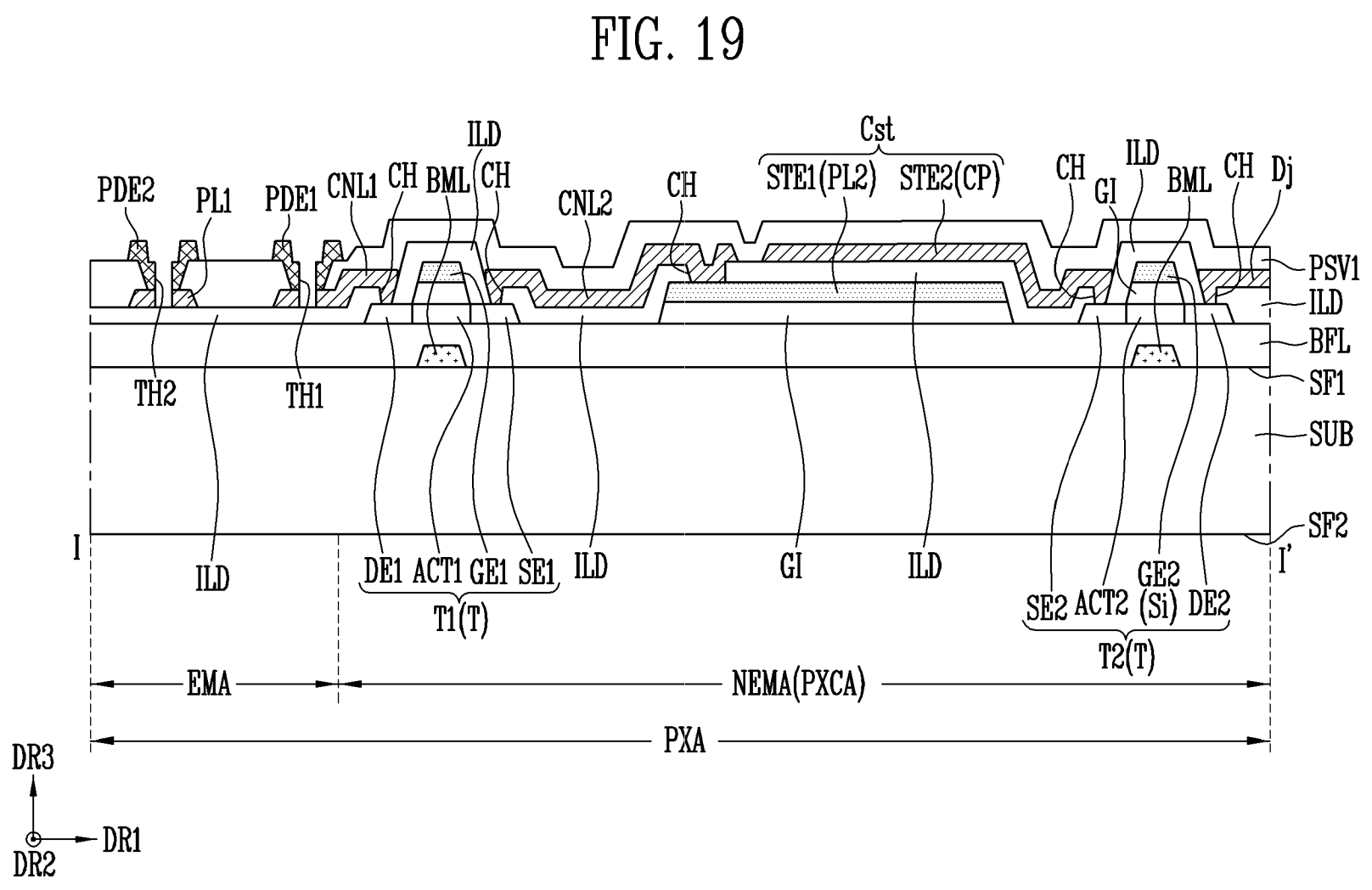

PSV1 ILD BFL SF1 SUB SF2
I'
Dj CH BML ILD GI CH
DE2 GE2 (Si) ACT2 SE2
T2(T)
Cst
STE1(PL2) STE2(CP)
ILD GI
CH CNL2 ILD
ILD CH BML CH CNL1
SE1 GE1 ACT1 DE1
T1(T)
PDE1 PL1 PDE2
TH1 TH2 ILD
NEMA(PXCA) EMA PXA
I
DR3 DR1 DR2

FIG. 21

LCP
CF
CCL
QD
INS2
INS1
LBP
CVL
LD
11
12
13
EL2
DPL
EL1
BUM1
CNL1
CNT1
PDE1
CH
BML
ILD
CNL2
Cst
STE1(PL2)
STE2(CP)
GI
Dj
PSV2
PSV1
BFL
SF1
SUB
SF2
BUM2
PCL
CNT2
PDE2
TH2
PL1
TH1
I
I'
DE1
ACT1
GE1
SE1
T1(T)
SE2
ACT2
GE2
(Si)
DE2
T2(T)
EMA
NEMA(PXCA)
PXA
DR3
DR1
DR2

DISPLAY DEVICE INCLUDING A LIGHT EMITTING ELEMENT CONNECTED TO A FIRST PAD ELECTRODE AND A SECOND PAD ELECTRODE AND MANUFACTURING METHOD THEREOF

CROSS-REFERENCE TO RELATED APPLICATION

This application claims priority to and the benefit of Korean patent application 10-2021-0045461 filed on Apr. 7, 2021 in the Korean Intellectual Property Office, the entire disclosure of which is incorporated by reference herein.

BACKGROUND

1. Field

The present disclosure generally relates to a display device and a manufacturing method thereof.

2. Related Art

As interest in information displays and demand for portable information media increase, research and commercialization has focused on display devices.

SUMMARY

One or more embodiments of the present disclosure provide a display device and a manufacturing method thereof, which may check whether a light emitting element has been bonded.

In accordance with an aspect of the present disclosure, there is provided a display device including: a substrate including a display area and a non-display area; and a pixel located in the display area, the pixel having an emission area and a pixel circuit area, wherein the pixel includes: at least one transistor located in the pixel circuit area; a first pad electrode and a second pad electrode spaced from each other and located in the emission area, the first pad electrode and the second pad electrode being electrically connected to the at least one transistor; a first through hole penetrating one region of the first pad electrode; a second through hole penetrating one region of the second pad electrode; and a light emitting element located in the emission area, the light emitting element being electrically connected to the first pad electrode and the second pad electrode.

The light emitting element may include: a semiconductor structure including a first semiconductor layer, an active layer on the first semiconductor layer, and a second semiconductor layer on the active layer; a first electrode located on the semiconductor structure, the first electrode being electrically connected to one of the first and second semiconductor layers; and a second electrode located on the semiconductor structure, the second electrode being electrically connected to an other one of the first and second semiconductor layers, the second electrode being spaced from the first electrode.

The display device may further include: a first bump metal located between the first electrode and the first pad electrode, the first bump metal bonding the first pad electrode and the light emitting element to each other; and a second bump metal located between the second electrode and the second pad electrode, the second bump metal bonding the second pad electrode and the light emitting element to each other. The first bump metal may be in direct contact with the first pad electrode, and the second bump metal may be in direct contact with the second pad electrode.

A width of each of the first and second bump metals may be greater than that of each of the first and second through holes, respectively.

The first bump metal may be partially located in the first through hole, and the second bump metal may be partially located in the second through hole.

The pixel may include a plurality of pixels. Each of the plurality of pixels may include the first and second through holes.

The pixel may include a plurality of pixels. At least some of the plurality of pixels may include the first and second through holes. Pixels located on odd-numbered columns with respect to a boundary between the display area and the non-display area among the plurality of pixels may include the first and second through holes.

The display device may further include: a first insulating layer, a second insulating layer, and a third insulating layer insulating layers sequentially stacked on the substrate; a connection line between the third insulating layer and the first pad electrode, the connection line being electrically connected to the first pad electrode; a first power line between the third insulating layer and the second pad electrode, the first power line being electrically connected to the second pad electrode; a second power line on the second insulating layer, the second power line being electrically connected to the at least one transistor; and a conductive pattern on the third insulating layer.

One region of the connection line that corresponds to the first through hole, may be removed in the emission area, and one region of the first power line that corresponds to the second through hole, may be removed in the emission area.

The conductive pattern may overlap the second power line with the third insulating layer interposed therebetween, thereby constituting a storage capacitor. The storage capacitor may include: a first storage electrode integrally formed with the second power line; and a second storage electrode integrally formed with the conductive pattern.

The pixel may further include: a light conversion pattern located above the light emitting element to correspond to the emission area; and a light blocking pattern located above the transistor to correspond to the pixel circuit area, the light blocking pattern being adjacent to the light conversion pattern.

The light conversion pattern may include: a color conversion layer converting light of a first color, which is emitted from the light emitting element, into light of a second color; and a color filter located above the color conversion layer, the color filter being configured to allow the light of the second color to be selectively transmitted therethrough.

The display device may further include a cover layer located throughout the emission area and the pixel circuit area, the cover layer covering the light emitting element.

In accordance with another aspect of the present disclosure, there is provided a display device including: a substrate including a display area and a non-display area; a pixel located in the display area, the pixel having an emission area and a pixel circuit area; and a dummy pixel located in the non-display area, the dummy pixel being spaced from the pixel, wherein the dummy pixel includes: a first dummy pad electrode and a second dummy pad electrode that are spaced from each other; a first through hole penetrating one region of the first dummy pad electrode; a second through hole penetrating one region of the second dummy pad electrode; and a first light emitting element including a first bump metal in contact with the first dummy pad electrode through the first through hole and a second bump metal in contact with the second dummy pad electrode through the second through hole.

The pixel may include: at least one transistor located in the pixel circuit area; a first pad electrode and a second pad electrode spaced from each other and located in the emission area, the first pad electrode and the second pad electrode, being electrically connected to the at least one transistor; an insulating layer located on the first and second pad electrodes, the insulating layer being partially opened to expose a portion of the first pad electrode and a portion of the second pad electrode; and a second light emitting element located in the emission area, the second light emitting element being in contact with the exposed first pad electrode, the second light emitting element being in contact with the exposed second pad electrode.

In accordance with still another aspect of the present disclosure, there is provided a method of manufacturing a display device, the method including: forming at least one transistor on a substrate; forming a connection line and a power line, which are electrically connected to the at least one transistor, on the at least one transistor, and forming a first through hole penetrating one region of the connection line and a second through hole penetrating one region of the power line; forming an insulating layer partially opened to expose one region of the power line and one region of the connection line; forming, on the insulating layer, a first pad electrode having an opening corresponding to the first through hole, and a second pad electrode having an opening corresponding to the second through hole, and bonding at least one light emitting element and each of the first and second pad electrodes to each other by placing, above the substrate, a transfer base to which the light emitting element is transferred.

The light emitting element may include: a semiconductor structure including a first semiconductor layer, an active layer on the first semiconductor layer, and a second semiconductor layer on the active layer; a first electrode located on the semiconductor structure, the first electrode being electrically connected to one of the first and second semiconductor layers; and a second electrode located on the semiconductor structure, the second electrode being electrically connected to an other one of the first and second semiconductor layers, the second electrode being spaced from the first electrode. The light emitting element may be electrically connected to the at least one transistor through a first bump metal located between the first electrode and the first pad electrode and a second bump metal located between the second electrode and the second pad electrode.

BRIEF DESCRIPTION OF THE DRAWINGS

One or more embodiments of the present disclosure will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of one or more embodiments to those skilled in the art.

In the drawing figures, dimensions may be exaggerated for clarity of illustration. It will be understood that when an element is referred to as being “between” two elements, it can be the only element between the two elements, or one or more intervening elements may also be present. Like reference numerals refer to like elements throughout.

FIG. 1 is a perspective view schematically illustrating a display device in accordance with one or more embodiments of the present disclosure.

FIGS. 9 and 10 schematically illustrate a pixel including a light emitting element, and are cross-sectional views corresponding to the line I-I' shown in FIG. 7.

FIGS. 11-20 are schematic cross-sectional views sequentially illustrating a manufacturing method of the pixel shown in FIG. 9.

FIGS. 21 and 22 schematically illustrate a pixel in accordance with one or more embodiments of the present disclosure, and are cross-sectional views corresponding to the line I-I' shown in FIG. 7.

DETAILED DESCRIPTION

Figure 2:
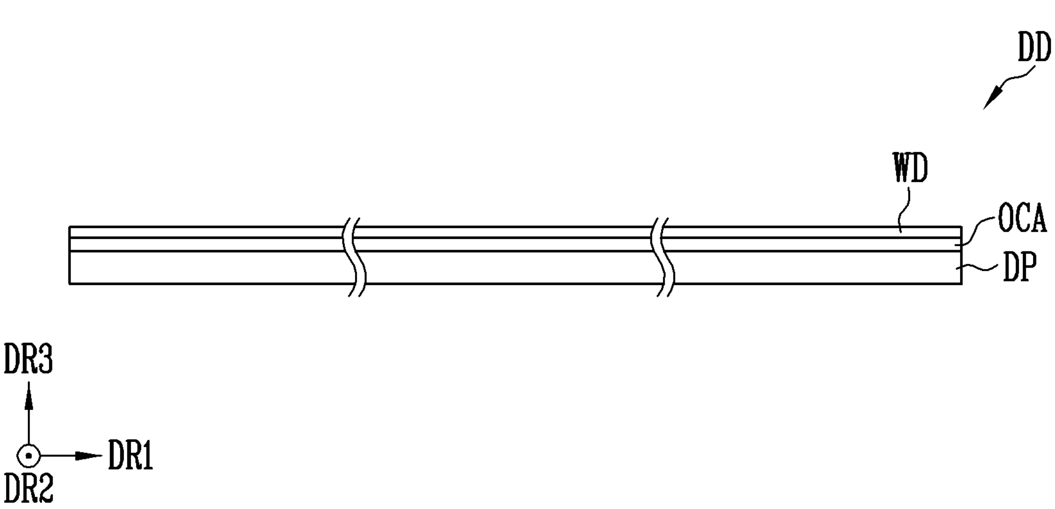
FIG. 2 is a cross-sectional view schematically illustrating the display device shown in FIG. 1.

The present disclosure may apply various changes and different shape, therefore only illustrate in details with one or more examples. However, the examples do not limit to certain shapes but apply to all the change and equivalent material and replacement. The drawings included are illustrated a fashion where the figures are expanded for the better understanding.

Like reference numbers refer to like elements throughout. In the drawings, the thickness of certain lines, layers, components, elements or features may be exaggerated for clarity. It will be understood that, although the terms “first”, “second”, etc. may be used herein to describe various elements, these elements should not be limited by these terms. These terms are only used to distinguish one element from another element. Thus, a “first” element discussed below could also be termed a “second” element without departing from the teachings of the present disclosure. As used herein, the singular forms are intended to include the plural forms as well, unless the context clearly indicates otherwise.

It will be further understood that the terms “includes” and/or “including”, when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate, or plate is placed "on" or "above" another element indicates not only a case where the element is placed "directly on" or "just above" the other element but also a case where a further element is interposed between the element and the other element. On the contrary, an expression that an element such as a layer, region, substrate, or plate is placed "beneath" or "below" another element indicates not only a case where the element is placed "directly beneath" or "just below" the other element but also a case where a further element is interposed between the element and the other element.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

Hereinafter, embodiments of the present disclosure and items required for those skilled in the art to easily understand the content of the present disclosure will be described in detail with reference to the accompanying drawings. In the following description, singular forms in the present disclosure are intended to include the plural forms as well, unless the context clearly indicates otherwise.

Figure 1:
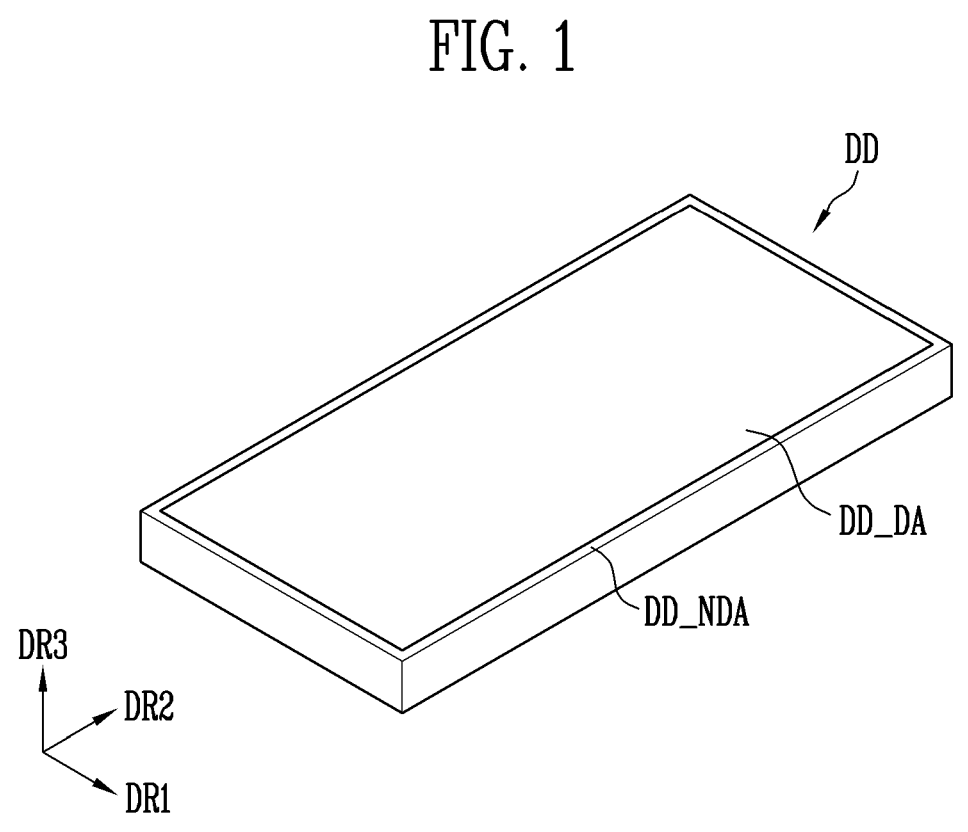
Figure 3:
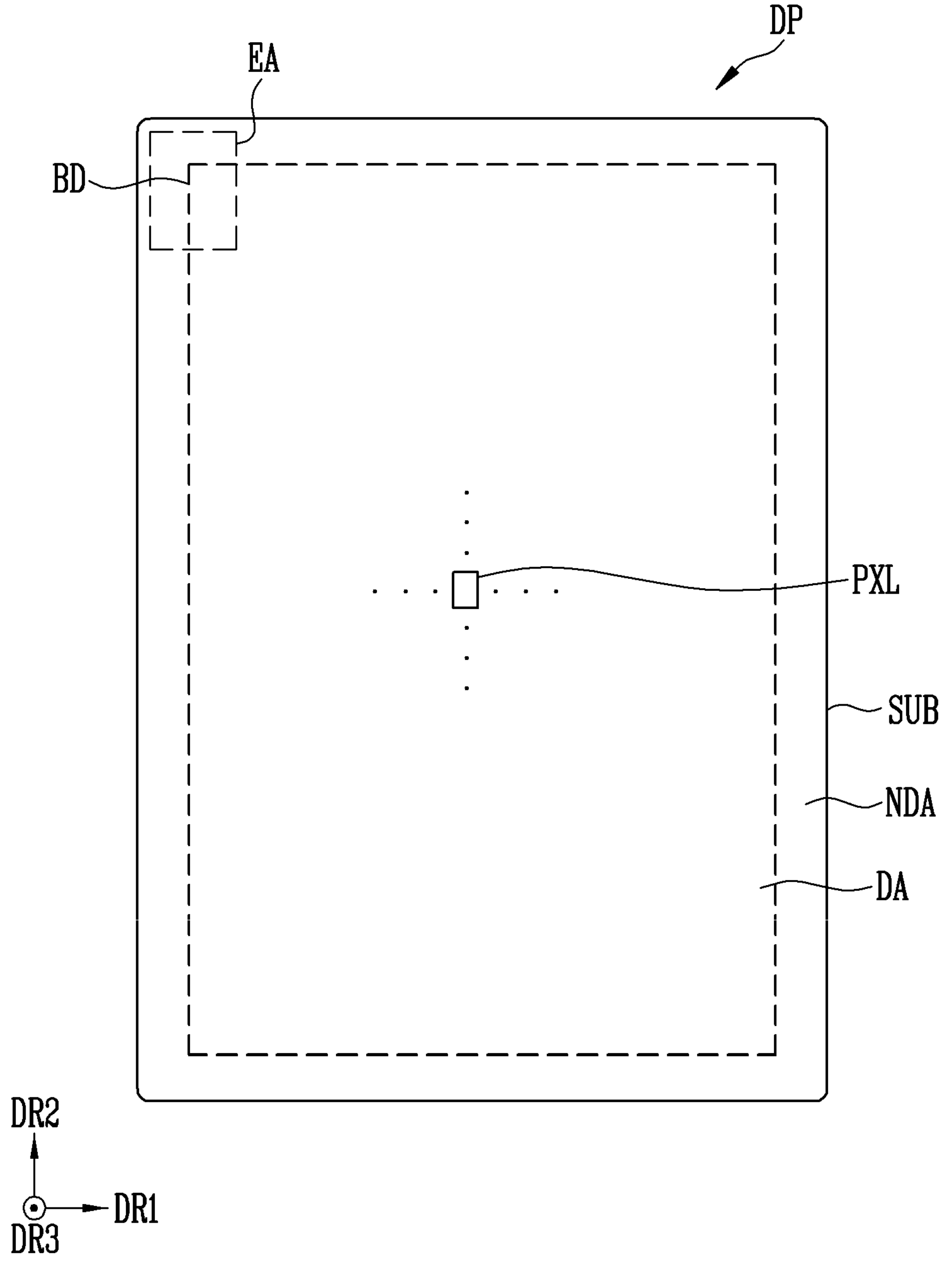
FIG. 3 is a plan view schematically illustrating a display panel in accordance with one or more embodiments of the present disclosure.
Figure 4:
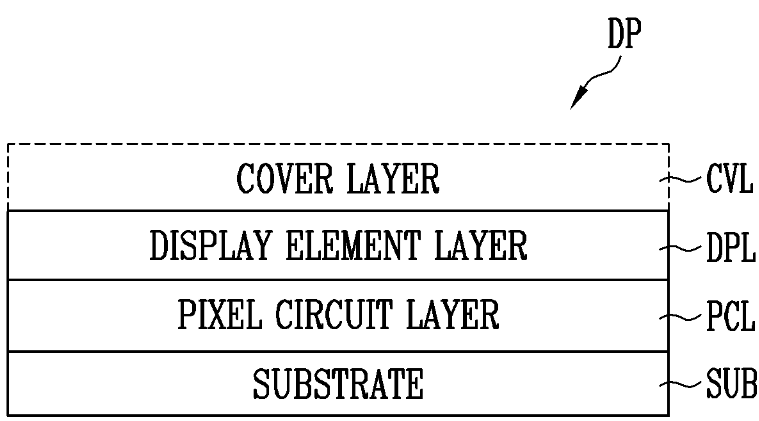
FIG. 4 is a cross-sectional view schematically illustrating a display panel in accordance with one or more embodiments of the present disclosure.

FIG. 1 is a perspective view schematically illustrating a display device DD in accordance with one or more embodiments of the present disclosure. FIG. 2 is a cross-sectional view schematically illustrating the display device DD shown in FIG. 1. FIG. 3 is a plan view schematically illustrating a display panel DP in accordance with one or more embodiments of the present disclosure. FIG. 4 is a cross-sectional view schematically illustrating a display panel DP in accordance with one or more embodiments of the present disclosure.

Referring to FIGS. 1-4, the display device DD may include a display panel DP and a window WD.

The present disclosure may be applied as long as the display device DD is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

The display device DD may be provided in various shapes. In an example, the display device DD may be provided in a rectangular plate shape having two pairs of sides parallel to each other, but the present disclosure is not limited thereto. When the display device DD is provided in the rectangular plate shape, any one pair of sides among the two pairs of sides may be provided longer than the other pair of sides. In the drawings, it is illustrated that the display device DD has prismatic corner portions having straight lines, but the present disclosure is not limited thereto. In some embodiments, in the display device DD provided in the rectangular plate shape, a corner portion at which one long side and one short side are in contact with each other may have a round shape.

In one or more embodiments of the present disclosure, a case where the display device DD has a rectangular shape having a pair of long sides and a pair of short sides is illustrated for convenience of description. An extending direction of the long sides is represented as a second direction DR2, an extending direction of the short sides is represented as a first direction DR1, and a direction perpendicular to the extending directions of the long sides and the short sides (or a perpendicular direction on a section) is represented as a third direction DR3. The first to third directions DR1, DR2, and DR3 may mean directions respectively indicated by the first to third directions DR1, DR2, and DR3.

In one or more embodiments of the present disclosure, at least a portion of the display device DD may have flexibility, and the display device DD may be folded at the portion having the flexibility.

The display device DD may include a display area DD_DA in which an image is displayed and a non-display area DD_NDA provided at at least one side of the display area DD_DA. The non-display area DD_NDA is an area in which the image is not displayed. However, the present disclosure is not limited thereto. In one or more embodiments, shapes of the display area DD_DA and the non-display area DD_NDA may be designed relative to each other.

In one or more embodiments, the display device DD may include a sensing area and a non-sensing area. The display device DD may not only display an image through the sensing area, but also sense a touch input made on a display surface (or input surface) or sense light incident at the front. The non-sensing area may be around (or surround) the sensing area. However, this is merely illustrative, and the present disclosure is not limited thereto. In one or more embodiments, a partial area of the display area DD_DA may correspond to the sensing area.

The display panel DP may display an image. A self-luminescent display panel, such as an Organic Light Emitting Display panel (OLED panel) using an organic light emitting diode as a light emitting element, a Nano-scale Light Emitting Diode Display panel (Nano-scale LED panel) using a nano-scale light emitting diode as a light emitting element, or a Quantum Dot Organic Light Emitting Display panel (QD OLED panel) using an organic light emitting diode and a quantum dot, may be used as the display panel DP. In addition, a non-self-luminescent display panel, such as a Liquid Crystal Display panel (LCD panel), an Electro-Phoretic Display panel (EPD panel), or an Electro-Wetting Display panel (EWD panel), may be used as the display panel DP. When a non-self-luminescent display panel is used as the display panel DP, the display device DD may be provided with a backlight unit which supplies light to the display panel DP.

The display panel DP may include a substrate SUB and a plurality of pixels PXL provided on the substrate SUB.

The substrate SUB may be formed as one area having an approximately rectangular shape. However, the number of areas provided in the substrate SUB may be different from the above-described example, and the substrate SUB may have different shapes according to an area provided in the substrate SUB.

The substrate SUB may be made of an insulative material such as glass or resin. Also, the substrate SUB may be made of a material having flexibility to be bendable and/or foldable, and have a single or multi-layered structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like. However, the material constituting the substrate SUB is not limited to the above-described embodiments.

The substrate SUB may include a display area DA and a non-display area NDA that is around an edge or periphery of the display area DA. The display area DA may be an area provided with the pixels PXL to display an image, and the non-display area NDA is an area in which the pixels PXL are not provided. The non-display area NDA may be an area in which the image is not displayed. For convenience of description, only one pixel PXL is illustrated in FIG. 3, but a plurality of pixels PXL may be substantially provided in the display area DA of the substrate SUB.

The display area DA of the substrate SUB (or the display panel DP) may correspond to the display area DD_DA of the display device DD, and the non-display area NDA of the substrate SUB (or the display panel DP) may correspond to the non-display area DD_NDA of the display device DD. The non-display area NDA may correspond to a bezel area of the display device DD.

The non-display area NDA may be provided at at least one side of the display area DA. The non-display area NDA may be around (or surround) an edge or periphery of the display area DA. The periphery of the display area DA may be a boundary BD between the non-display area NDA and the display area DA. A line unit connected to the pixels PXL and a driving unit connected to the line unit to drive the pixels PXL may be provided in the non-display area NDA.

The line unit may electrically connect the driving unit and the pixels PXL to each other. The line unit provides a signal to each pixel PXL, and may include signal lines connected to each pixel PXL, e.g., fan-out lines connected to a scan line, a data line, and the like.

The pixels PXL may be provided in the display region DA of the substrate SUB. Each of the pixels PXL may be a minimum unit to display an image. Each of the pixels PXL may include a light emitting element emitting white light and/or colored light. Each of the pixels PXL may emit any one color among red, green, and blue. However, the present disclosure is not limited thereto, and the pixel PXL may emit light of a color such as cyan, magenta, or yellow.

The pixels PXL may be arranged in a matrix form along rows extending in the first direction DR1 and columns extending in the second direction DR2 intersecting the first direction DR1. However, the arrangement form of the pixels PXL is not particularly limited, and the pixels PXL may be arranged in various forms. In the drawings, it is illustrated that the pixels PXL have a rectangular shape. However, the present disclosure is not limited thereto, and the pixels PXL may be modified in various shapes. In addition, when a plurality of pixels PXL are provided, the plurality of pixels PXL may be provided to different areas (or sizes). For example, when pixels PXL having different colors of lights emitted therefrom are provided, the pixels PXL may be provided to have different areas (or sizes) or different shapes with respect to the colors.

The driving unit may control driving of each pixel PXL by providing a suitable signal (e.g., a predetermined signal) and power from a suitable power source (e.g., a predetermined power source) to the pixel PXL through the line unit.

The display panel DP may include a pixel circuit layer PCL, a display element layer DPL, and a cover layer CVL.

The pixel circuit layer PCL is provided on the substrate SUB, and may include a plurality of transistors and signal lines connected to the transistors. By way of example, each transistor may include source, channel, and drain regions formed in a semiconductor layer with a gate electrode separated from the channel region by an insulating layer. In other embodiments, for example, each transistor may have a form in which a semiconductor layer, a gate electrode, a first terminal, and a second terminal are sequentially stacked with an insulating layer interposed therebetween. The semiconductor layer may include amorphous silicon, poly-silicon, low temperature poly-silicon, and an organic semiconductor. The gate electrode, the first terminal, and the second terminal may include one of aluminum (A1), copper (Cu), titanium (Ti), and molybdenum (Mo), but the present disclosure is not limited thereto. Also, the pixel circuit layer PCL may include at least one insulating layer.

The display element layer DPL may be disposed on the pixel circuit layer PCL. The display element layer DPL may include a light emitting element that emits light. The light emitting element may be, for example, an organic light emitting diode, but the present disclosure is not limited thereto. In some embodiments, the light emitting element may be an inorganic light emitting element including an inorganic light emitting material or a light emitting element which emits light by changing a wavelength of light emitted using a quantum dot.

The cover layer CVL may be selectively disposed on the display element layer DPL. The cover layer CVL may be an encapsulation substrate or have the form of an encapsulation layer provided as a multi-layer. When the cover layer CVL has the form of the encapsulation layer, the cover layer CVL may include an inorganic layer and/or an organic layer. For example, the cover layer CVL may have a form in which an inorganic layer, an organic layer, and/or an inorganic layer are sequentially stacked. The cover layer CVL may prevent external air and external moisture from infiltrating into the display element layer DPL and the pixel circuit layer PCL.

In some embodiments, the cover layer CVL may be made of a thermosetting resin and/or a photocurable resin, to be coated in a liquid form on the substrate SUB and then cured through a curing process using heat and/or light. The cover layer CVL may protect the light emitting element and more stably fix the light emitting element therebelow.

The window WD for protecting an exposed surface of the display panel DP may be provided on the display panel DP. The window WD may protect the display panel DP from external impact, and provide an input surface and/or a display surface to a user. The window WD may be coupled to the display panel DP by using an optically clear adhesive (or cohesive) member OCA.

The window WD may have a multi-layered structure including materials selected from a glass substrate, a plastic film, and the plastic substrate. This multi-layered structure may be formed through a continuous process or an adhesive process using an adhesive layer. The whole or a portion of the window WD may have flexibility.

A touch sensor may be disposed between the display panel DP and the window WD. The touch sensor may be disposed directly on a surface on which an image is displayed in the display panel DP, to receive a touch input of a user.

Figure 5:
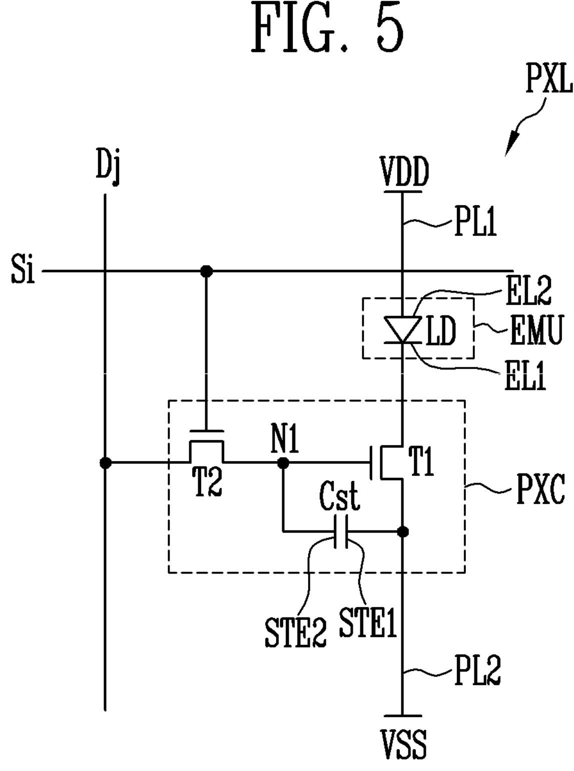
FIG. 5 is a circuit diagram illustrating an electrical connection relationship between components included in one pixel shown in FIG. 3 in accordance with one or more embodiments of the present disclosure.

FIG. 5 is a circuit diagram illustrating an electrical connection relationship between components included in one pixel shown in FIG. 3 in accordance with one or more embodiments of the present disclosure.

For example, FIG. 5 illustrates an electrical connection relationship between components included in a pixel PXL that may be applied to an active matrix type display device in accordance with one or more embodiments of the present disclosure. However, types of components included in a pixel PXL to which one or more embodiments of the present disclosure may be applied are not limited thereto.

In FIG. 5, in addition to components included in the pixel PXL shown in FIG. 3, even an area in which the components are provided is inclusively designated as a pixel PXL.

Referring to FIGS. 1-5, the pixel PXL may include a light emitting unit EMU (or light emitting part) which generates light with a luminance corresponding to a data signal. Also, the pixel PXL may selectively further include a pixel circuit PXC for driving the light emitting unit EMU.

In some embodiments, the light emitting unit EMU may include a light emitting element LD connected between a first power line PL1 to which a voltage of a first driving power source VDD is applied and a second power line PL2 to which a voltage of a second driving power source VSS is applied. The light emitting element LD may include a second electrode EL2 connected to the first driving power source VDD through the first power line PL1 and a first electrode EL1 connected to the second driving power source VSS through the second power line PL2. In one or more embodiments, the second electrode EL2 may be an anode, and the first electrode EL1 may be a cathode.

The light emitting element LD may emit light with a luminance corresponding to a driving current supplied through the pixel circuit PXC. For example, the pixel circuit PXC may supply, to the light emitting unit EMU, a driving current corresponding to a grayscale value of corresponding frame data, for each frame period. The driving current supplied to the light emitting unit EMU may flow through the light emitting element LD. Accordingly, the light emitting unit EMU may emit light while the light emitting element LD emits light with a luminance corresponding to the driving current.

The pixel circuit PXC may be connected to a scan line Si and a data line Dj of the pixel PXL. By way of example, when assuming that the pixel PXL is disposed on an ith (i is a natural number) row and a jth (j is a natural number) column of the display area DA, the pixel circuit PXC of the pixel PXL may be connected to an ith scan line Si and a jth data line Dj. In one or more embodiments, the pixel circuit PXC may include first and second transistors T1 and T2 and a storage capacitor Cst. However, the structure of the pixel circuit PXC is not limited to the embodiment according to FIG. 5.

The first transistor T1 is a driving transistor for controlling the driving current applied to the light emitting unit EMU, and may be connected between the light emitting unit EMU and the second driving power source VSS. For example, a first terminal of the first transistor T1 may be connected (or coupled) to the light emitting unit EMU, a second terminal of the first transistor T1 may be connected to the second driving power source VSS through the second power line PL2, and a gate electrode of the first transistor T1 may be connected to a first node N1. The first transistor T1 may control an amount of driving current flowing from the first driving power source VDD to the light emitting unit EMU according to a voltage applied to the first node N1. In one or more embodiments, the first terminal of the first transistor T1 may be a drain electrode, and the second terminal of the first transistor T1 may be a source electrode.

The second transistor T2 is a switching transistor that selects a pixel PXL in response to a scan signal applied to the scan line Si and activates the pixel PXL, and may be connected between the data line Dj and the first node N1. A first terminal of the second transistor T2 may be connected to the data line Dj, a second terminal of the second transistor T2 may be connected to the first node N1, and a gate electrode of the second transistor T2 may be connected to the scan line Si. The first terminal and the second terminal of the second transistor T2 are different terminals. For example, when the first terminal is a drain electrode, the second terminal may be a source electrode.

The second transistor T2 may be turned on when a scan signal having a gate-on voltage (e.g., a high level voltage) is supplied from the scan line Si, to electrically connect the data line Dj and the first node N1 to each other. The first node N1 is a point at which the second terminal of the second transistor T2 and the gate electrode of the first transistor T1 are connected to each other, and the second transistor T2 may transfer a data signal to the gate electrode of the first transistor T1.

One electrode STE1 (or first storage electrode) of the storage capacitor Cst may be connected to the second driving power source VSS, and another electrode STE2 (or second storage electrode) of the storage capacitor Cst may be connected to the first node N1. The storage capacitor Cst charges to a voltage (i.e. holds a charge) corresponding to a data signal supplied to the first node N1, and maintains the charged voltage until a data signal of a next frame is supplied.

In FIG. 5, the pixel circuit PXC has been illustrated, which includes the second transistor T2 for transferring a data signal to the inside of the pixel PXL, the storage capacitor Cst for storing the data signal, and the first transistor T1 for supplying a driving current corresponding to the data signal to the light emitting element LD.

However, the present disclosure is not limited thereto, and the structure of the pixel circuit PXC may be variously modified and embodied.

Figure 6:
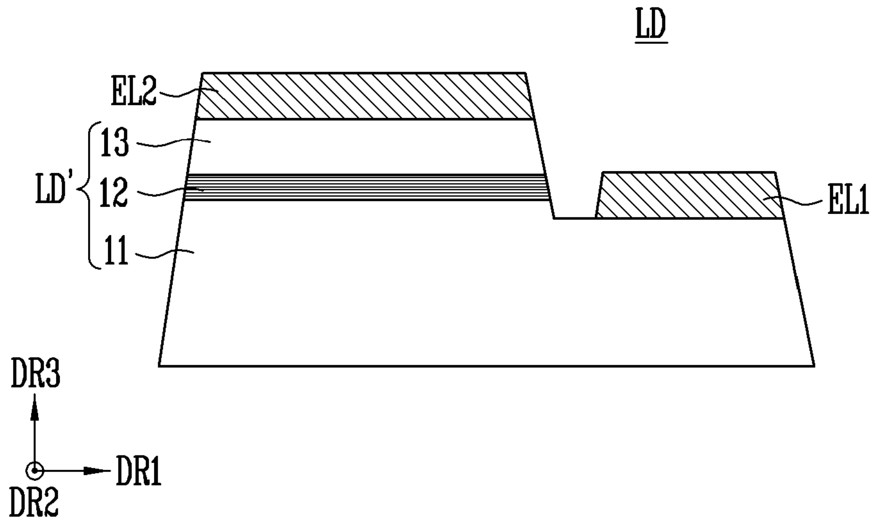
FIG. 6 is a side sectional view schematically illustrating a light emitting element shown in FIG. 5.

FIG. 6 is a side sectional view schematically illustrating the light emitting element shown in FIG. 5.

Referring to FIGS. 5 and 6, the light emitting element LD may include a semiconductor structure LD', a first electrode EL1, and a second electrode EL2.

The semiconductor structure LD' may emit light when electrons and holes are recombined with each other according to a current flowing between the first electrode EL1 and the second electrode EL2. The light emission of the semiconductor structure LD' is controlled by using such a principle, so that the light emitting element LD may be used as a light source (or light emitting source) for various light emitting elements, including the pixel PXL.

A first semiconductor layer 11 may include, for example, at least one n-type semiconductor layer. For example, the first semiconductor layer 11 may include any one semiconductor material among InAlGaN, GaN, AlGaN, InGaN, AlN, and InN, and be an n-type semiconductor layer doped with a first conductive dopant (or n-type dopant) such as Si, Ge, or Sn. However, the material constituting the first semiconductor layer 11 is not limited thereto. In addition, the first semiconductor layer 11 may be configured with various materials. In one or more embodiments of the present disclosure, the first semiconductor layer 11 may include a gallium nitride (GaN) semiconductor material doped with the first conductive dopant (or n-type dopant).

An active layer 12 is disposed on one side of the first semiconductor layer 11, and may be formed in a single or multiple quantum well structure. In one or more embodiments, when the active layer 12 is formed in the multiple quantum well structure, a barrier layer, a strain reinforcing layer, and a well layer, which constitute one unit, may be periodically and repeatedly stacked in the active layer 12. The strain reinforcing layer may have a lattice constant smaller than that of the barrier layer, to further reinforce strain, e.g., compressive strain applied to the well layer. However, the structure of the active layer 12 is not limited to the above-described embodiment.

The active layer 12 may emit light having a wavelength of 400 nm to 900 nm, and use a double hetero structure. In one or more embodiments of the present disclosure, a clad layer doped with a conductive dopant may be formed on the top and/or the bottom of the active layer 12 along the third direction DR3. In one or more embodiments, the clad layer may be formed as an AlGaN layer or InAlGaN layer. In one or more embodiments, a material such as AlGaN or AlInGaN may be used to form the active layer 12. In addition, the active layer 12 may be configured with various materials. The active layer 12 may include a first surface in contact with the first semiconductor layer 11 and a second surface in contact with a second semiconductor layer 13.

The second semiconductor layer 13 is disposed on the second surface of the active layer 12, and provides holes to the active layer 12. The second semiconductor layer 13 may include a semiconductor layer having a type different from that of the first semiconductor layer 11. In one or more embodiments, the second semiconductor layer 13 may include at least one p-type semiconductor material. For example, the second semiconductor layer 13 may include at least one semiconductor material among InAlGaN, GaN, AlGaN, InGaN, AlN, and InN, and include a p-type semiconductor layer doped with a second conductive dopant (or p-type dopant) such as Mg. However, the material constituting the second semiconductor layer 13 is not limited thereto. In addition, the second semiconductor layer 13 may be configured with various materials. In one or more embodiments of the present disclosure, the second semiconductor layer 13 may include a gallium nitride (GaN) semiconductor material doped with the second conductive dopant (or p-type dopant). The second semiconductor layer 13 may include a lower surface in contact with the second surface of the active layer 12 along the third direction DR3 and an upper surface in contact with the second electrode EL2 along the third direction DR3.

The first semiconductor layer 11, the active layer 12, and the second semiconductor layer 13, which are described above, may be provided in a structure in which the first semiconductor layer 11, the active layer 12, and the second semiconductor layer 13 are sequentially stacked on a semiconductor substrate. The semiconductor substrate may include a semiconductor material, such as a sapphire substrate or a silicon substrate. The semiconductor substrate may be used as a growth substrate for growing each of the first semiconductor layer 11, the active layer 12, and the second semiconductor layer 13, and then separated from the first semiconductor layer 11 through a substrate separation process. The substrate separation process may be Laser Lift-Off (LLO), Chemical Lift-Off (CLO), or the like. Accordingly, when the semiconductor substrate for growth is removed in the semiconductor structure LD', the semiconductor structure LD' may have a relatively less thickness (e.g., may become thinner). The above-described semiconductor structure LD' may have a small size to a degree of micrometer scale, but the present disclosure is not limited thereto.

The above-described semiconductor structure LD' may include a mesa interface. The mesa interface may be formed by removing a portion of each of the second semiconductor layer 13, the active layer 12, and the first semiconductor layer 11 through an etching process. The etching process may be, for example, a dry etching process.

The first electrode EL1 may be provided and/or formed on the semiconductor structure LD'. In one or more embodiments, the first electrode EL1 may be provided and/or formed on the first semiconductor layer 11 to be electrically separated from the active layer 12 and the second semiconductor layer 13. In one or more embodiments, the first electrode EL1 may be in contact with one bump metal for bonding of the light emitting element LD.

The second electrode EL2 may be provided and/or formed on the semiconductor structure LD'. In one or more embodiments, the second electrode EL2 may be provided and/or formed on the second semiconductor layer 13. In one or more embodiments, the second electrode EL2 may be in contact with another bump metal for the bonding of the light emitting element LD.

The first electrode EL1 may be a contact electrode in ohmic contact with the first semiconductor layer 11, and the second electrode EL2 may be a contact electrode in ohmic contact with the second semiconductor layer 13. In one or more embodiments, the first and second electrodes EL1 and EL2 may be schottky contact electrodes.

The first and second electrodes EL1 and EL2 may include a conductive material. For example, the first and second electrodes EL1 and EL2 may include an opaque metal using one or mixture of chromium (Cr), titanium (Ti), aluminum (Al), gold (Au), nickel (Ni), and any alloy thereof, but the present disclosure is not limited thereto. In one or more embodiments, the first and second electrodes EL1 and EL2 may include a transparent conductive oxide such as indium tin oxide (ITO), indium zinc oxide (IZO), zinc oxide (ZnO), indium gallium zinc oxide (IGZO), or indium tin zinc oxide (ITZO).

The above-described semiconductor structure LD' may emit light when electrons and holes are recombined with each other according to the current flowing between the first electrode EL1 and the second electrode EL2. Light emitted from the semiconductor structure LD' advances toward the first and second electrodes EL1 and EL2 and then advances toward a front surface (or top surface) of the substrate ("SUB" shown in FIG. 4), thereby displaying an image.

Figure 7:
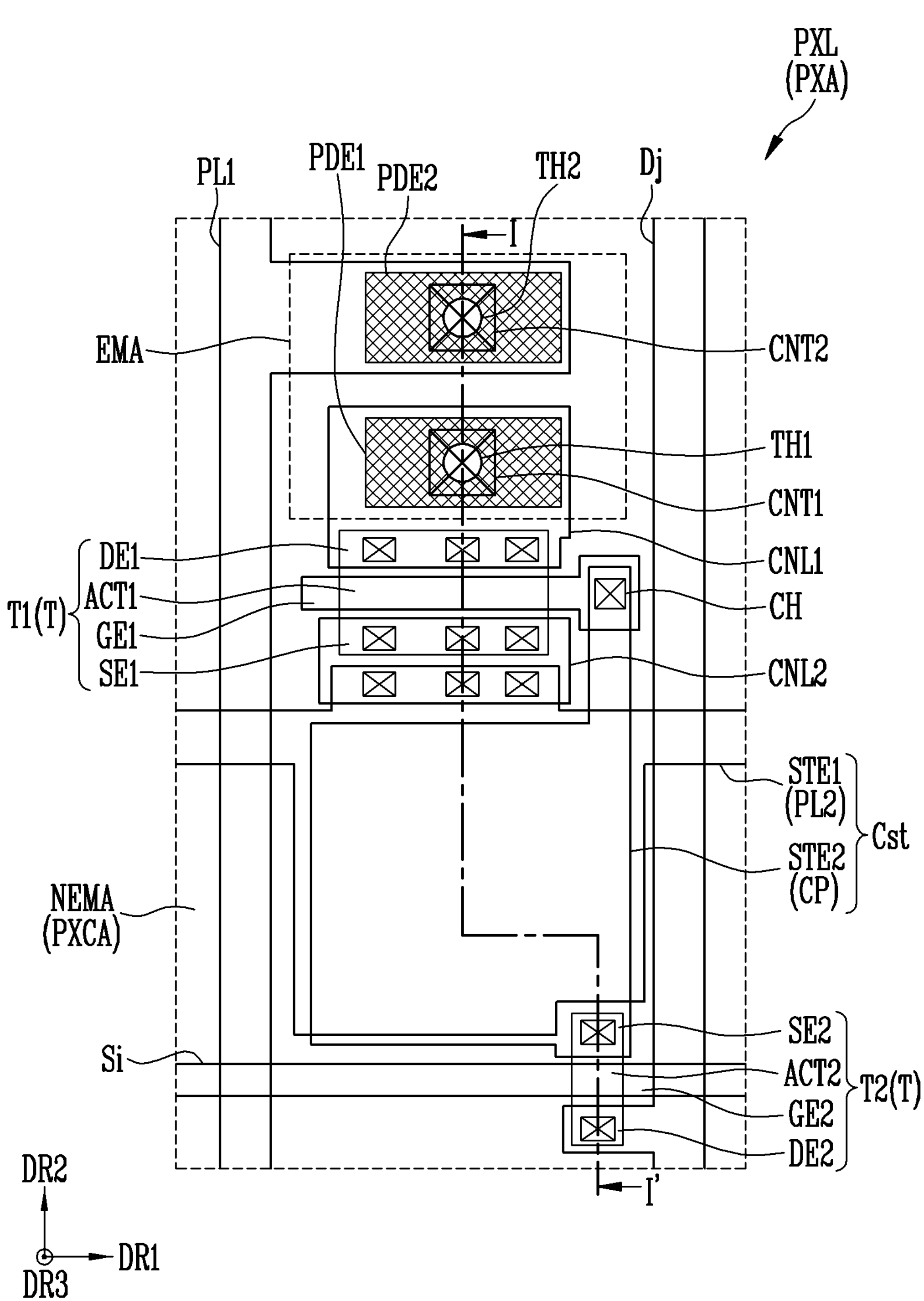
FIG. 7 is a plan view schematically illustrating the one pixel shown in FIG. 3.
Figure 8:
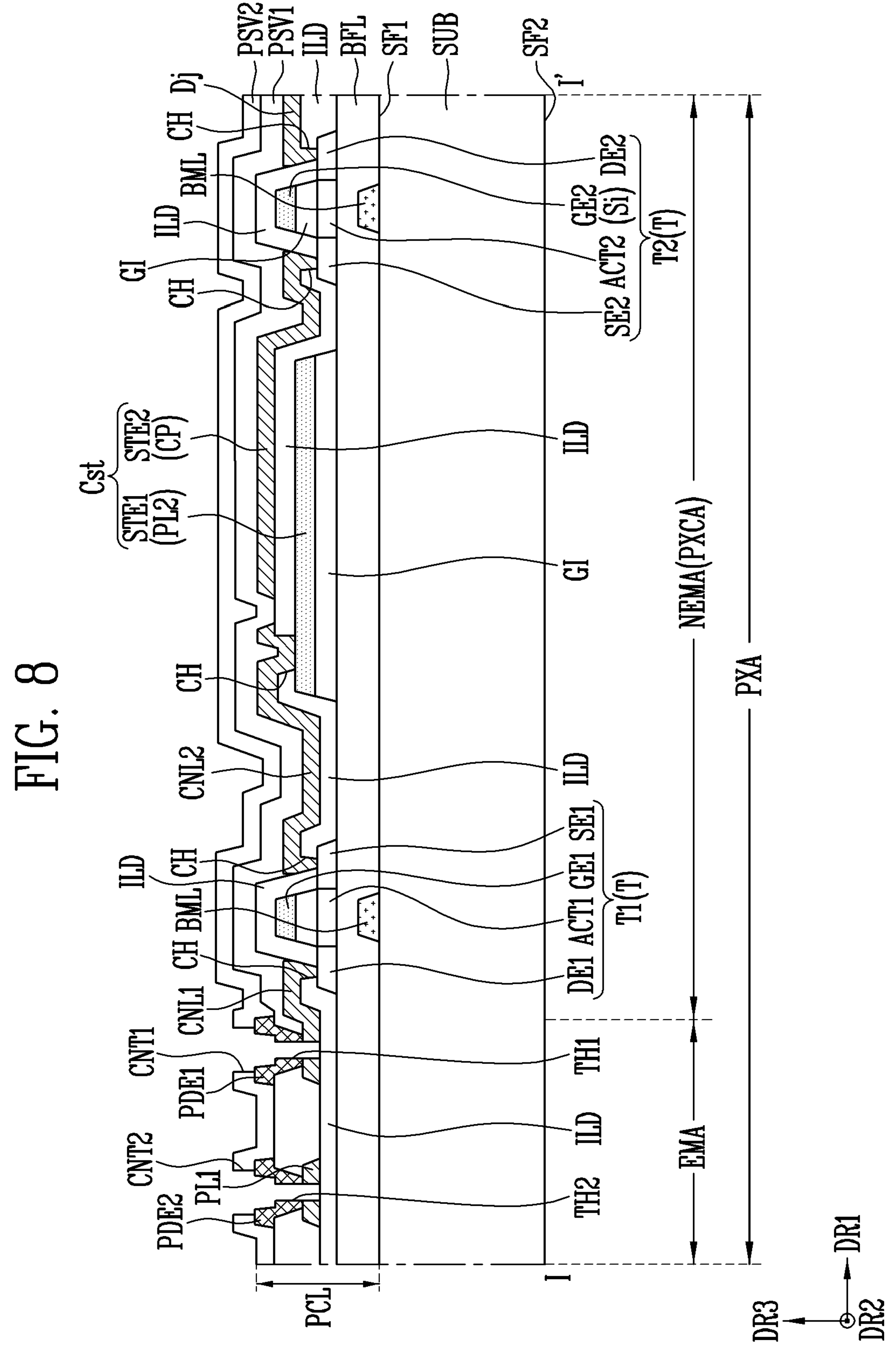
FIG. 8 is a cross-sectional view taken along the line I-I' shown in FIG. 7.
Figure 12:
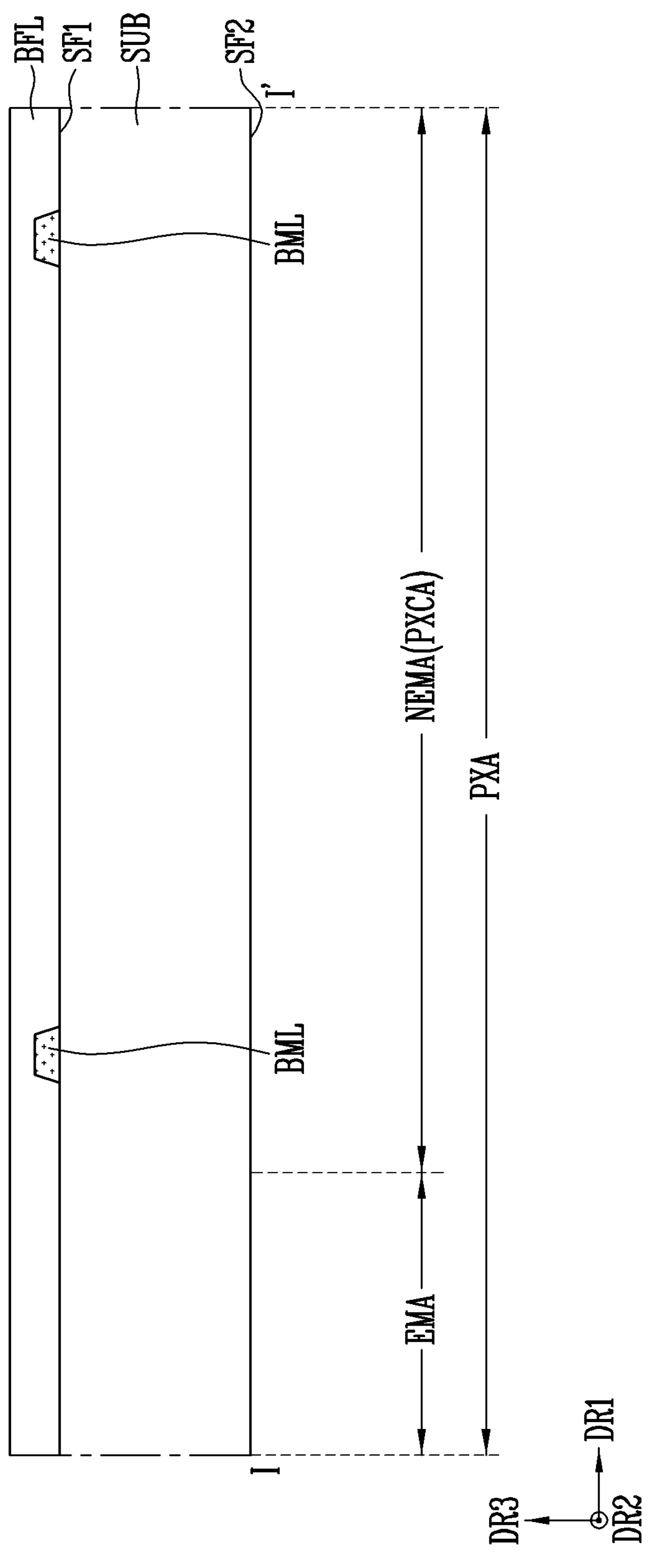
Figure 20:
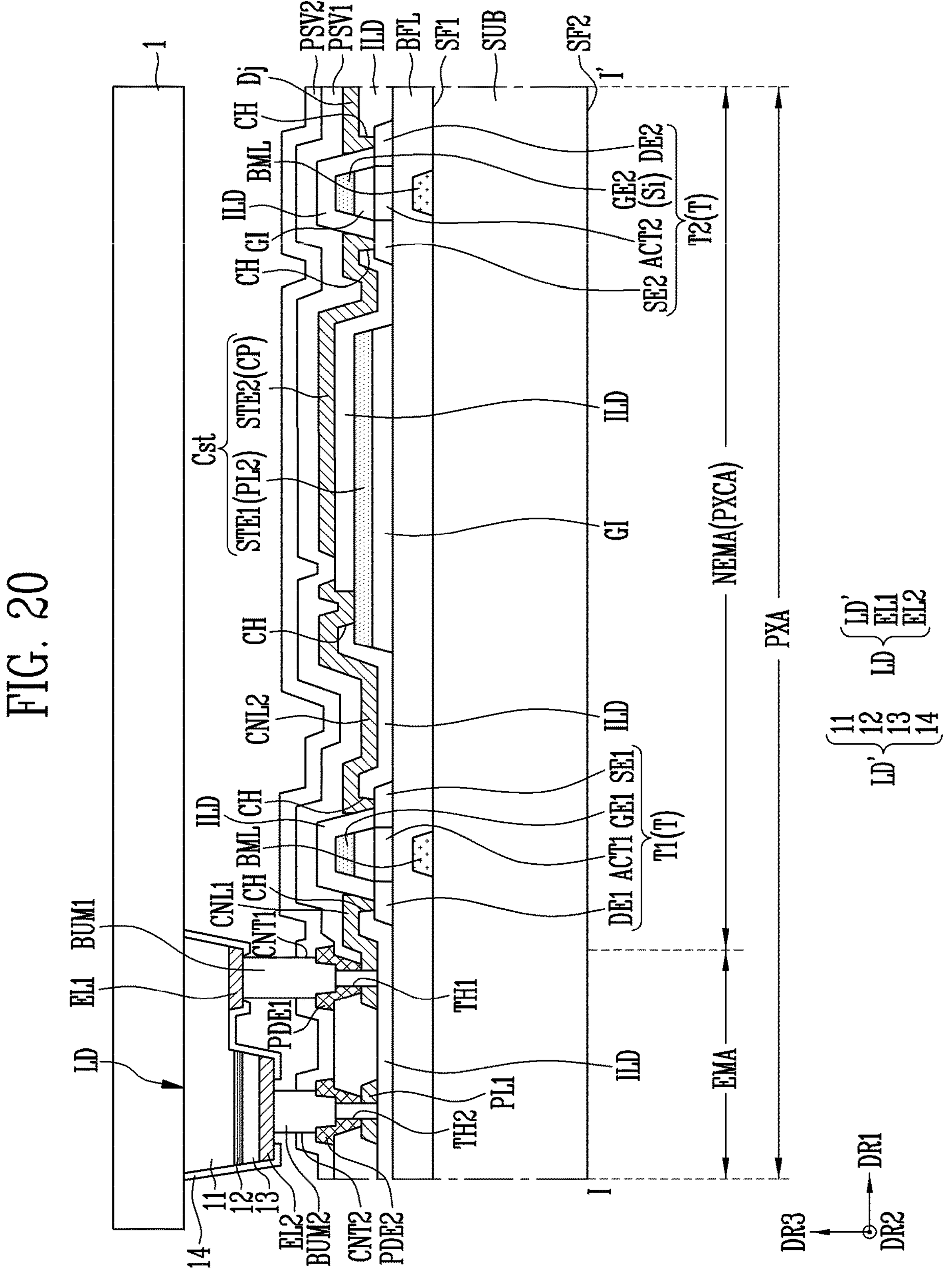

FIG. 7 is a plan view schematically illustrating the one pixel shown in FIG. 3. FIG. 8 is a cross-sectional view taken along the line I-I' shown in FIG. 7.

A structure of an emission area EMA and a non-emission area NEMA (or pixel circuit area PXCA) in accordance with one or more embodiments of the present disclosure is schematically illustrated based on a pixel area PXA in which the one pixel PXL is disposed.

In FIGS. 7 and 8, for convenience of description, a lateral direction (or horizontal direction) on a plane is represented as the first direction DR1, a longitudinal direction (or vertical direction) on a plane is represented as the second direction DR2, and a thickness direction of a substrate SUB on a section is represented as the third direction DR3. The first to third directions DR1, DR2, and DR3 may mean directions respectively indicated by the first to third directions DR1, DR2, and DR3.

In FIG. 8, the one pixel PXL is simplified and illustrated, such as a case where each electrode is illustrated as only a single-layered electrode and a case where each insulating layer is illustrated as only a single-layered insulating layer. However, the present disclosure is not limited thereto.

In one or more embodiments of the present disclosure, the term "connection" between two components may include both electrical connection and physical connection, but the present disclosure is not necessarily limited thereto.

In one or more embodiments of the present disclosure, the term "being formed and/or provided in (or at) the same layer" may mean being formed in the same process, and the term "being formed and/or provided in different layers" may mean being formed in different processes. However, the present disclosure is not necessarily limited thereto.

Referring to FIGS. 1-8, the pixel PXL may be provided and/or formed in the pixel area PXA provided on the substrate SUB. The pixel area PXA is one area of the display area DA, and may include the emission area EMA and the non-emission area NEMA. The non-emission area NEMA may be the pixel circuit area PXCA in which the pixel circuit PXC for driving the light emitting element LD is located.

A plurality of insulating layers and a plurality of conductive layers may be disposed on the substrate SUB. The insulating layers may include, for example, a buffer layer BFL, a gate insulating layer GI, an interlayer insulating layer ILD, and first and second passivation layers PSV1 and PSV2, which are sequentially provided on the substrate SUB. The conductive layers may be provided and/or formed between the above-described insulating layers. The conductive layers may include, for example, a first conductive layer provided and/or formed on the substrate SUB, a second conductive layer provided and/or formed on the gate insulating layer GI, a third conductive layer provided and/or formed on the interlayer insulating layer ILD, and a fourth conductive layer provided and/or formed on the first passivation layer PSV1. However, the insulating layers and the conductive layers, which are provided on the substrate SUB, are not limited to the above-described embodiment. In one or more embodiments, another insulating layer and another conductive layer in addition to the insulating layers and the conductive layers may be provided and/or formed on the substrate SUB.

A signal line electrically connected to the pixel PXL may be located on the substrate SUB. The signal line may include a plurality of signal lines for transferring a desired signal (e.g., a predetermined signal (or predetermined voltage)) to the pixel PXL. The plurality of signal lines may include, for example, a scan line Si, a data line Dj, a first power line PL1, and a second power line PL2. The above-described signal line may be located in the pixel circuit area PXCA. In one or more embodiments, at least one area (or a portion) of the first power line PL1 may be located in the emission area EMA.

The scan line Si may be the second conductive layer provided and/or formed on the gate insulating layer GI. The second conductive layer may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layered structure including molybdenum (Mo), titanium (Ti), copper (Cu), aluminum (Al) or silver (Ag), which is a low-resistance material so as to decrease wiring resistance. The scan line Si may be provided in a shape extending in the first direction DR1, and a scan signal may be applied to the scan line Si.

The gate insulating layer GI may be an inorganic insulating layer including an inorganic material. In one or more embodiments, the gate insulating layer GI may include at least one of silicon nitride ($SiN_x$), silicon oxide ($SiO_x$), silicon oxynitride ($SiO_xN_y$), and metal oxide such as aluminum oxide ($AlO_x$). However, the material of the gate insulating layer GI is not limited to the above-described embodiments. In one or more embodiments, the gate insulating layer GI may be an organic insulating layer including an organic material. The gate insulating layer GI may be provided as a single layer, but may be provided as a multi-layer including at least two layers. In one or more embodiments of the present disclosure, the gate insulating layer GI may be located only on the bottom of the second conductive layer. In one or more embodiments, the gate insulating layer GI may be located only on the bottom of each of the scan line Si, first and second gate electrodes GE1 and GE2, and the second power line PL2.

The data line Dj may be electrically connected to a second transistor T2 of the pixel circuit PXC. The data line Dj may be the third conductive layer provided and/or formed on the interlayer insulating layer ILD. The third conductive layer may include the same material as the second conductive layer or include at least one material selected from the material discussed as the material constituting the second conductive layer. The data line Dj may be provided in a shape extending in a direction different from the first direction DR1, e.g., the second direction DR2 intersecting the first direction DR1, and a data signal may be applied to the data line Dj.

The interlayer insulating layer ILD is located on the top of the second conductive layer and the gate insulating layer GI, and may include the same material as the gate insulating layer GI or include at least one material selected from the materials discussed as the material constituting the gate insulating layer GI. In one or more embodiments, the interlayer insulating layer ILD may be an inorganic insulating layer including an inorganic material.

The voltage of the first driving power source VDD may be applied to the first power line PL1. The first power line PL1 extends along the second direction DR2, and may be disposed to be spaced from the data line Dj. The first power line PL1 may be the third conductive layer provided and/or formed on the interlayer insulating layer ILD. The first power line PL1 may be formed through the same process as the data line Dj, to including the same material as the data line Dj and to be provided in the same layer as the data line Dj.

The voltage of the second driving power source VSS may be applied to the second power line PL2. The second power line PL2 may be the second conductive layer provided and/or formed on the gate insulating layer GI. The second power line PL2 may be formed through the same process as the scan line Si, to include the same material as the scan line Si and to be provided at the same layer as the scan line Si. The second power line PL2 may be spaced from the scan line Si while overlapping a portion of each of the first power line PL1 and the data line Dj between the first power line PL1 and the data line Dj. In one or more embodiments, the second power line PL2 may be integrally provided with a first storage electrode STE1 of the storage capacitor Cst.

The pixel PXL may include a pixel circuit layer PCL (or circuit element layer) including the pixel circuit PXC. The pixel circuit PXC may be located in the pixel circuit area PXCA.

The pixel circuit layer PCL may include the buffer layer BFL, the gate insulating layer GI, the interlayer insulating layer ILD, the first and second the passivation layers PSV1 and PSV2, and the pixel circuit PXC. In addition, the pixel circuit layer PCL may include a first pad electrode PDE1 and a second pad electrode PDE2 located in the emission area EMA.

The buffer layer BFL is located on the first conductive layer, and may prevent an impurity or the like from being diffused into the pixel circuit PXC. The buffer layer BFL may be an inorganic insulating layer including an inorganic material. The buffer layer BFL may include, for example, at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided as a single layer, but may be provided as a multi-layer including at least two layers. When the buffer layer BFL is provided as the multi-layer, the layers may be formed of the same material or be formed of different materials. The buffer layer BFL may be omitted according to the material and process conditions of the substrate SUB.

The pixel circuit PXC may include at least one transistor T and at least one storage capacitor Cst. In an example, the pixel circuit PXC may include a first transistor T1, the second transistor T2, and the storage capacitor Cst. In the following embodiment, when the first transistor T1 and the second transistor T2 are inclusively designated, each of the first transistor T1 and the second transistor T2 or both the first transistor T1 and the second transistor T2 are referred to as a transistor T or transistors T.

The first transistor T1 may include the first gate electrode GE1, a first active pattern ACT1, a first source region SE1, and a first drain region DE1.

The first gate electrode GE1 may be electrically connected to a second source region SE2 of the second transistor T2 through a conductive pattern CP. The first gate electrode GE1 may be the second conductive layer provided and/or formed on the gate insulating layer GI.

The conductive pattern CP may be the third conductive layer provided and/or formed on the interlayer insulating layer ILD. One end of the conductive pattern CP may be electrically and/or physically connected to the first gate electrode GE1 through a contact hole CH penetrating the interlayer insulating layer ILD. The other end of the conductive pattern CP may be electrically and/or physically connected to the second source region SE2 of the second transistor T2 through a contact hole CH penetrating the interlayer insulating layer ILD. In one or more embodiments of the present disclosure, the conductive pattern CP may be integrally provided with a second storage electrode STE2 of the storage capacitor Cst.

Each of the first active pattern ACT1, the first source region SE1, and the first drain region DE1 may be a semiconductor pattern made of poly-silicon, amorphous silicon, oxide semiconductor, etc. Each of the first active pattern ACT1, the first source region SE1, and the first drain region DE1 may be formed as a semiconductor layer doped or undoped with an impurity. In one or more embodiments, each of the first source region SE1 and the first drain region DE1 may be formed as a semiconductor layer doped with the impurity, and the first active pattern ACT1 may be formed as a semiconductor layer undoped with the impurity. In one or more embodiments, an n-type impurity may be used as the impurity, but the present disclosure is not limited thereto.

The first active pattern ACT1, the first source region SE1, and the first drain region DE1 may be provided and/or formed on the buffer layer BFL.

The first active pattern ACT1 is a region overlapping the first gate electrode GE1 in the third direction DR3, and may be a channel region of the first transistor T1. When the first active pattern ACT1 is formed long, the channel region of the first transistor T1 may be formed long. The driving range of a suitable voltage (e.g., a predetermined voltage) applied to the first transistor T1 may be widened. Thus, the grayscale of light (or ray) emitted from the light emitting element LD may be finely controlled.

The first source region SE1 may be connected to (or in contact with) one end of the first active pattern ACT1. Also, the first source region SE1 may be electrically and/or physically connected to the second power line PL2 through a second connection line CNL2.

The second connection line CNL2 may be the third conductive layer provided and/or formed on the interlayer insulating layer ILD. One end of the second connection line CNL2 may be electrically and/or physically connected to the first source region SE1 through at least one contact hole CH penetrating the interlayer insulating layer ILD. The other end of the second connection line CNL2 may be electrically and/or physically connected to the second power line PL2 through at least another contact hole CH penetrating the interlayer insulating layer ILD.

The first drain electrode DE1 may be connected to the other end of the first active pattern ACT1. Also, the first drain electrode DE1 may be electrically and/or physically connected to a first pad electrode PDE1 through a first connection line CNL1.

The first connection line CNL1 may be the third conductive layer provided and/or formed on the interlayer insulating layer ILD. One end of the first connection line CNL1 may be electrically and/or physically connected to the first drain region DE1 through at least one contact hole CH penetrating the interlayer insulating layer ILD.

The other end of the first connection line CNL1 may be electrically and/or physically connected to the first pad electrode PDE1 exposed by the first passivation layer PSV1 which is partially opened.

The first passivation layer PSV1 may be provided and/or formed on the third conductive layer including the first connection line CNL1. The first passivation layer PSV1 may be provided in a form including an organic insulating layer, an inorganic insulating layer, or the organic insulating layer disposed on the inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). For example, the organic insulating layer may include at least one of polyacrylates resin, epoxy resin, phenolic resin, polyamides resin, polyimides resin, unsaturated polyesters resin, poly-phenylene ethers resin, poly-phenylene sulfides resin, and benzocyclobutenes resin.

The first passivation layer PSV1 may be partially opened to expose one region of each of the first power line PL1 and the first connection line CNL1.

The second transistor T2 may include the second gate electrode GE2, a second active pattern ACT2, the second source region SE2, and a second drain region DE2.

The second gate electrode GE2 may be integrally provided with the scan line Si to be connected to the scan line Si. The second gate electrode GE2 may be one region of the scan line Si.

Each of the second active pattern ACT2, the second source region SE2, and the second drain region DE2 may be a semiconductor pattern made of poly-silicon, amorphous silicon, oxide semiconductor, etc. Each of the second active pattern ACT2, the second source region SE2, and the second drain region DE2 may be formed as a semiconductor layer doped or undoped with an impurity. In one or more embodiments, each of the second source region SE2 and the second drain region DE2 may be formed as a semiconductor layer doped with the impurity, and the second active pattern ACT2 may be formed as a semiconductor layer undoped with the impurity. In an example, an n-type impurity may be used as the impurity.

The second active pattern ACT2, the second source region SE2, and the second drain region DE2 may be provided and/or formed on the buffer layer BFL.

The second active pattern ACT2 is a region overlapping the second gate electrode GE2 in the third direction DR3, and may be a channel region of the second transistor T2.

The second source region SE2 may be connected to one end of the second active pattern ACT2. Also, the second source region SE2 may be connected to the first gate electrode GE1 through the conductive pattern CP.

The second drain region DE2 may be connected to the other end of the second active pattern ACT2. Also, the second drain region DE2 may be electrically and/or physically connected to the data line Dj through a contact hole CH penetrating the interlayer insulating layer ILD. Accordingly, a data signal applied to the data line Dj may be transferred to the second drain region DE2.

The storage capacitor Cst may include the first storage electrode STE1 and the second storage electrode STE2.

The first storage electrode STE1 may be integrally provided with the second power line PL2. The first storage electrode STE1 may be one region (or a portion) of the second power line PL2, the second power line PL2 may be one region of the first storage electrode STE1.

The second storage electrode STE2 is located on the first storage electrode STE1 with the interlayer insulating layer ILD interposed therebetween, and may overlap the first storage electrode STE1 in the third direction DR3. The second storage electrode STE2 may be integrally provided with the conductive pattern CP. The second storage electrode STE may be one region (or a portion) of the conductive pattern CP, or the conductive pattern CP may be one region of the second storage electrode STE2.

A bottom metal layer BML overlapping the transistor T in the third direction DR3 may be provided and/or formed on the substrate SUB. In one or more embodiments, the bottom metal layer BML may be located between the substrate SUB and each of the first and second transistors T1 and T2. The bottom metal layer BML may be the first conductive layer as a first conductive layer among the conductive layers provided and/or formed on the substrate SUB. The bottom metal layer BML located under the first transistor T1 may overlap the channel region (or the first active pattern ACT1) of the first transistor T1 in the third direction DR3, and the bottom metal layer BML located under the second transistor T2 may overlap the channel region (or the second active pattern ACT2) of the second transistor T2 in the third direction DR3.

In one or more embodiments, the bottom metal layer BML located under the first transistor T1 may be electrically connected to the first transistor T1, to widen the driving range of a suitable voltage (e.g., a predetermined voltage) supplied to the first gate electrode GE1 of the first transistor T1. In one or more embodiments, the bottom metal layer BML may be electrically and/or physically connected to one of the first source region SE1 and the first drain region DE1 of the first transistor T1.

In some embodiments, the bottom metal layer BML may be used as a light blocking member that protects the channel region of each of the first and second transistors T1 and T2 by blocking light introduced through a second surface SF2 of the substrate SUB. To this end, the bottom metal layer BML may be made of a conductive material (or substance) having a constant reflexibility.

The first pad electrode PDE1 may be located in the emission area EMA. The first pad electrode PDE1 may be the fourth conductive layer provided and/or formed on the first passivation layer PSV1. The fourth conductive layer may include the same material as the second conductive layer or include at least one material selected from the materials discussed as the material constituting the second conductive layer.

The first pad electrode PDE1 may be electrically and/or physically connected to the first transistor T1 through the exposed first connection line CNL1. Also, the first pad electrode PDE1 may be electrically connected to the light emitting element LD through a first contact part CNT1, to be used as a connection electrode for electrically connecting the light emitting element LD and the pixel circuit PXC to each other.

A second pad electrode PDE2 may be located in the emission area EMA. The second pad electrode PDE2 may be the fourth conductive layer provided and/or formed on the first passivation layer PSV1.

The second pad electrode PDE2 may be electrically and/or physically connected to the exposed first power line PL1. Also, the second pad electrode PDE2 may be electrically connected to the light emitting element LD through a second contact part CNT2, to be used as a connection electrode for electrically connecting the light emitting element LD and the pixel circuit PXC to each other.

The second passivation layer PSV2 may be provided and/or formed over the first and second pad electrodes PDE1 and PDE2.

The second passivation layer PSV2 may include the same material as the first passivation layer PSV1 or include at least one material selected from the materials discussed as the material constituting the first passivation layer PSV1. The second passivation layer PSV2 may include the first contact part CNT1 and the second contact part CNT2. The first contact part CNT1 may expose one region of the first pad electrode PDE1. The second contact part CNT2 may expose one region of the second pad electrode PDE2.

The above-described pixel PXL may include a first through hole TH1 and a second through hole TH2, which are located in the emission area EMA. In one or more embodiments, the first through hole TH1 may correspond to the first contact part CNT1, and the second through hole TH2 may correspond to the second contact part CNT2.

Each of the first and second through holes TH1 and TH2 may be formed by removing one region of a partial component of the pixel circuit layer PCL in the third direction DR3.

In one or more embodiments, the first through hole TH1 may be formed (or provided) while sequentially penetrating one region of each of the first pad electrode PDE1 and the first connection line CNL1. Accordingly, each of the first pad electrode PDE1 and the first connection line CNL1 may be partially opened by the first through hole TH1. When viewed on a section, each of the first pad electrode PDE1 and the first connection line CNL1 may include two parts that are facing each other with the first through hole TH1 interposed therebetween.

In one or more embodiments, the second through hole TH2 may be formed (or provided) while sequentially penetrating one region of each of the second pad electrode PDE2 and the first power line PL1. Accordingly, each of the second pad electrode PDE2 and the first power line PL1 may be partially opened by the second through hole TH2. When viewed on a section, each of the second pad electrode PDE2 and the first power line PL1 may include two parts that are facing each other with the second through hole TH2 interposed therebetween.

Each of the first and second through holes TH1 and TH2 may correspond to the position of the light emitting element LD. In one or more embodiments, each of the first and second through holes TH1 and TH2 may correspond to the position at which the light emitting element LD is bonded or coupled. In one or more embodiments, whether the light emitting element LD has been bonded may be easily checked by using the first and second through holes TH1 and TH2.

Each of the first and second pad electrodes PDE1 and PDE2 may electrically connect the light emitting element LD and the pixel circuit PXC by being bonded to a bump metal of the light emitting element LD.

Hereinafter, the light emitting element LD bonded to the first and second pad electrodes PDE1 and PDE2 will be described with reference to FIGS. 9 and 10.

Figure 9:
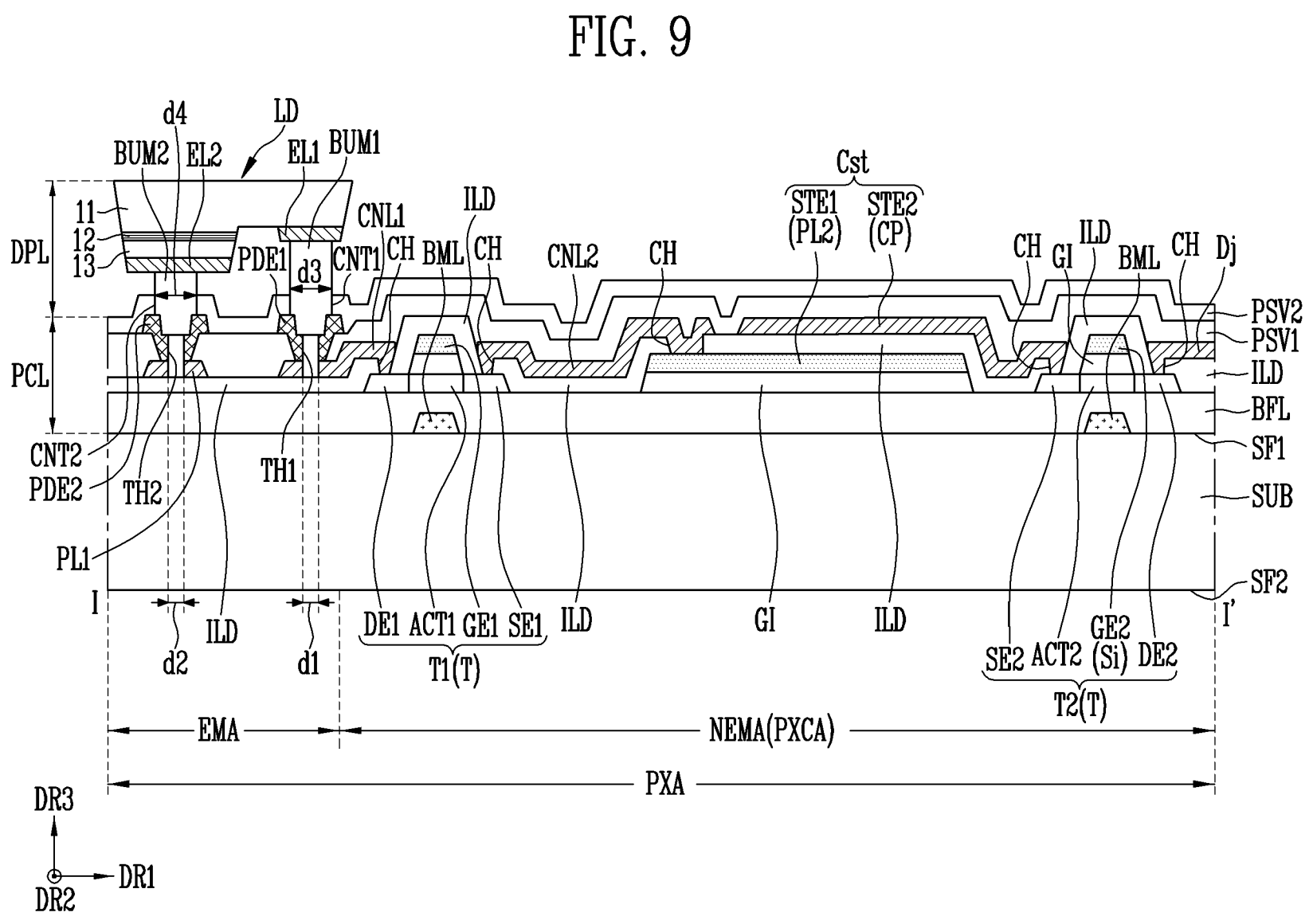
Figure 10:
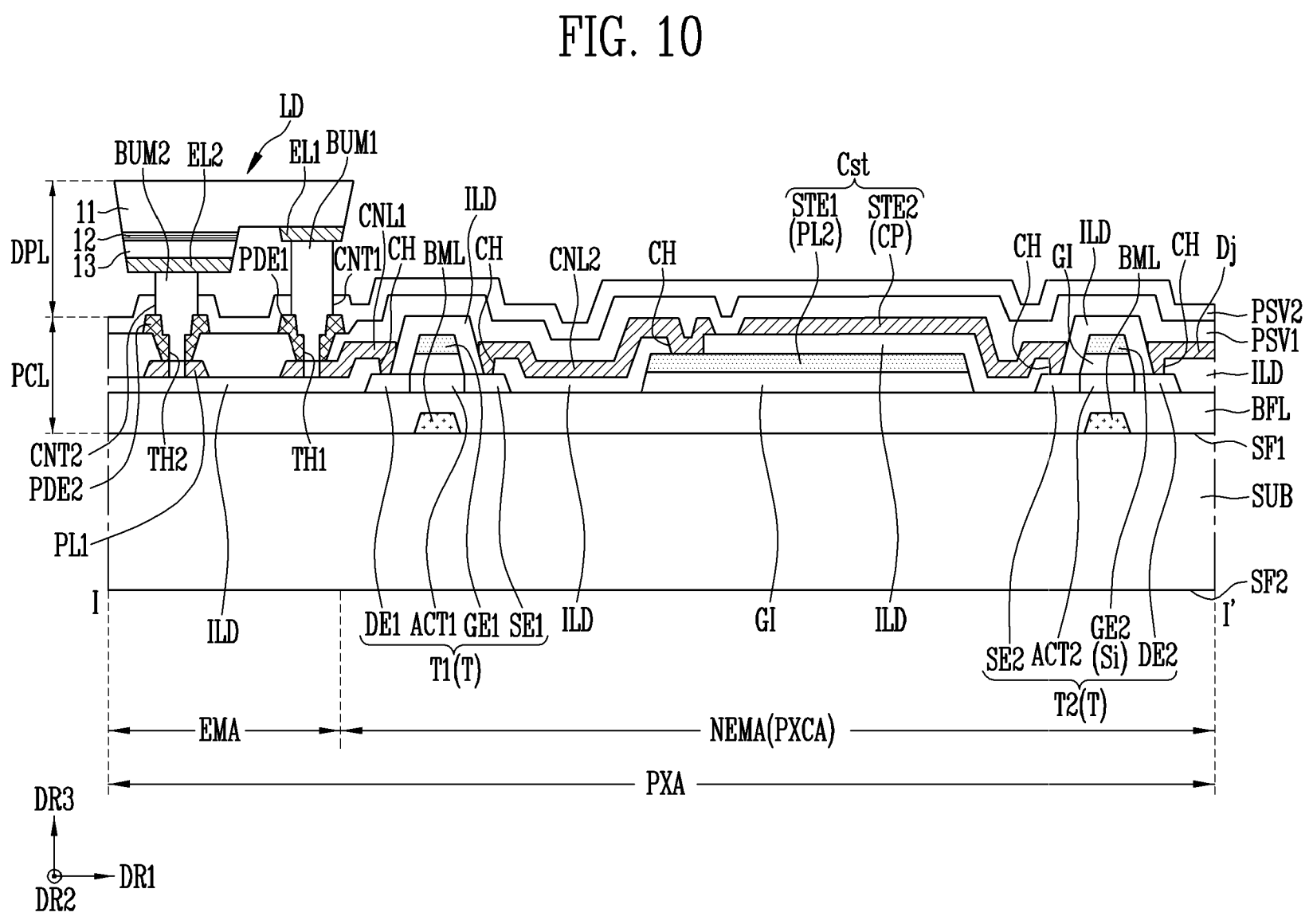

FIGS. 9 and 10 schematically illustrate the pixel PXL including the light emitting element LD, and are cross-sectional views corresponding to the line I-I' shown in FIG. 7.

One or more embodiments shown in FIGS. 9 and 10 represent different embodiments in relation to the positions of first and second bump metals BUM1 and BUM2. For example, an embodiment in which the first bump metal BUM1 is in contact with the first pad electrode PDE1 and the second bump metal BUM2 is in contact with the second pad electrode PDE2 is disclosed in FIG. 9, and an embodiment in which the first bump metal BUM1 is introduced into the first through hole TH1 to be in contact with the first connection line CNL1 and the second bump BUM2 is introduced into the second through hole TH2 to be in contact with the first power line PL1 is disclosed in FIG. 10.

In relation to the pixel PXL shown in FIGS. 9 and 10, portions different from those of the above-described embodiment will be mainly described to avoid redundancy.

Referring to FIGS. 6-10, the pixel PXL may include a display element layer DPL located on the pixel circuit layer PCL. The display element layer DPL may include a light emitting element LD bonded to each of the first and second pad electrodes PDE1 and PDE2.

The light emitting element LD may include a semiconductor structure LD', a first electrode EL1, and a second electrode EL2. The semiconductor structure LD' may be formed by sequentially forming a first semiconductor layer 11, an active layer 12, and a second semiconductor layer 13 and then performing mesa etching. The first electrode EL1 and the second electrode EL2 may be sequentially formed on the semiconductor structure LD', thereby forming a package type light emitting element LD.

The light emitting element LD may be bonded to each of the first and second pad electrodes PDE1 and PDE2 by using a bump metal. In one or more embodiments, the light emitting element LD may be bonded to the first pad electrode PDE1 by using the first bump metal BUM1, and may be bonded to the second pad electrode PDE2 by using the second bump metal BUM2.

The first and second bump metals BUM1 and BUM2 may be made of a conductive material (or substance) having a constant reflexibility. The conductive material (or substance) may include an opaque metal suitable to reflect light emitted from the active layer 12 of the light emitting element LD in an image display direction (e.g., the third direction DR3) of the display device (see "DD" shown in FIG. 1). The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), or any alloy thereof.

In some embodiments, the first and second bump metals BUM1 and BUM2 may be made of eutectic metal. For example, the first and second bump metals BUM1 and BUM2 may be made of tin (Sn), indium (In), zinc (Zn), lead (Pb), nickel (Ni), gold (Au), platinum (Pt), copper (Cu) or the like, but the present disclosure is not limited thereto.

Also, in one or more embodiments, each of first and second bump metals BUM1 and BUM2 may be a solder bump.

Also, each of first and second bump metals BUM1 and BUM2 may be used as a guide member for guiding light which is emitted from the active layer 12 of the light emitting element LD and then advances toward the first and second through holes TH1 and TH2 in the image display direction of the display device DD.

The first bump metal BUM1 may be electrically and physically connected to the first electrode EL1, and the second bump metal BUM2 may be electrically and physically connected to the second electrode EL2. In one or more embodiments, an adhesive layer may be provided each of between the first bump metal BUM1 and the first electrode EL1 and between the second bump metal BUM2 and the second electrode EL2. The first bump metal BUM1 and the first electrode EL1 may be more stably connected to each other, and the second bump metal BUM2 and the second electrode EL2 may be more stably connected to each other.

The first bump metal BUM1 may be located at an upper portion of the first pad electrode PDE1, which is exposed by the first contact part CNT1, and the second bump metal BUM2 may be located at an upper portion of the second pad electrode PDE2, which is exposed by the second contact part CNT2. Accordingly, the first bump metal BUM1 may correspond to the first through hole TH1, and the second bump metal BUM2 may correspond to the second through hole TH2.

A bonding method may be used to electrically connect the light emitting element LD and the pixel circuit PXC to each other. An anisotropic conductive film (ACF) bonding method, a laser assist bonding (LAB) method using laser, an ultrasonic bonding method, a ball grid array (BGA) mounting method, a thermo compression (TC) bonding method, and the like may be used as the bonding method. The TC bonding method may refer to a method of electrically and physically connecting a bump metal and a pad electrode to each other by allowing the bump metal and the pad electrode to be in contact with each other, heating the bump metal and the pad electrode at a temperature higher than the melting point of the bump metal, and then applying pressure to the bump metal and the pad electrode.

In the above-described embodiment, the first and second bump metals BUM1 and BUM2 and the first and second pad electrodes PDE1 and PDE2 may be electrically connected to each other by moving the light emitting element LD transferred to a transfer base by a feeding mechanism to the top of the first and second pad electrodes PDE1 and PDE2 and then performing a bonding process using the TC bonding method. As described above, when heat and pressure are applied to perform bonding of the first and second bump metals BUM1 and BUM2 and the first and second pad electrodes PDE1 and PDE2, an intermetallic compound may be generated and grown each of between the first bump metal BUM1 and the first pad electrode PDE1 and between the second bump metal BUM2 and the second pad electrode PDE2. The light emitting element LD and the pixel circuit PXC may be electrically and physically connected to each other due to the intermetallic compound.

In the above-described bonding process, the first bump metal BUM1 may be in contact with the first pad electrode PDE1 partially opened by the first through hole TH1. The first pad electrode PDE1 may be opened by a width d1 of the first through hole TH1. In one or more embodiments, the width d1 of the first through hole TH1 may be smaller than the width d3 of the first bump metal BUM1. That is, the width d3 of the first bump metal BUM1 may be greater than that d1 of the first through hole TH1. In the bonding process, the intermetallic compound may be sufficiently formed at an interface between the first bump metal BUM1 and the first pad electrode PDE1.

When the width d3 of the first bump metal BUM1 is smaller than or equal to that d1 of the first through hole TH1, the first bump metal BUM1 may be inserted into the first through hole TH1 between two portions of the first pad electrode PDE1, which face (or oppose) each other, when the light emitting element LD and the first pad electrode PDE1 are bonded to each other. When the first bump metal BUM1 is inserted into the first through hole TH1 of the first pad electrode PDE1, the first bump metal BUM1 may be in contact with a side surface of the first pad electrode PDE1, and may be surrounded by the first pad electrode PDE1. The first bump metal BUM1 cannot sufficiently receive pressure applied in the bonding process due to the first pad electrode PDE1, and therefore, the intermetallic compound may not be formed at the interface between the first bump metal BUM1 and the first pad electrode PDE1. Accordingly, the first bump metal BUM1 and the first pad electrode PDE1 may not be electrically and physically connected to each other.

Similarly, in the above-described bonding process, the second bump metal BUM2 may be in contact with the second electrode pad PDE2 partially opened by the second through hole TH2. The second pad electrode PDE2 may be partially opened by a width d2 of the second through hole TH2. In one or more embodiments, the width d2 of the second through hole TH2 may be smaller than that d4 of the second bump metal BUM2. That is, the width d4 of the second bump metal BUM2 may be greater than that d2 of the second through hole TH2. In the bonding process, the intermetallic compound may be sufficiently formed at an interface between the second bump metal BUM2 and the second pad electrode PDE2.

In one or more embodiments, the width d1 of the first through hole TH1 and the width d2 of the second through hole TH2 may be equal to each other, but the present disclosure is not limited thereto. In one or more embodiments, the width d1 of the first through hole TH1 and the width d2 of the second through hole TH2 may be different from each other. Also, in one or more embodiments, the width d3 of the first bump metal BUM1 and the width d4 of the second bump metal BUM2 may be equal to or different from each other.

When the light emitting element LD and the pixel circuit PXC are electrically connected to each other by performing the above-described bonding process, one end of the first bump metal BUM1 may be in contact with the first electrode EL1, and the other end of the first bump metal BUM1 may be in contact with the first pad electrode PDE1. The other end of the first bump metal BUM1 may be in contact with the two portions of the first pad electrode PDE1, which face (or oppose) each other, by the first through hole TH1 therebetween. In some embodiments, the first bump metal BUM1 may be introduced into the first through hole TH1 in the above-described bonding process. As shown in FIG. 10, the first bump metal BUM1 may be in contact with each of the first pad electrode PDE1 partially opened by the first through hole TH1 and the first connection line CNL1 partially opened by the first through hole TH1. In one or more embodiments, when the first bump metal BUM1 is introduced into the first through hole TH1 while being melted in the above-described bonding process, the first bump metal BUM1 may be partially filled in the first through hole TH1, to be in contact with each of the first pad electrode PDE1 and the first connection line CNL1, which are partially opened by the first through hole TH1.

Similarly, when the light emitting element LD and the pixel circuit PXC are electrically connected to each other by performing the above-described bonding process, one end of the second bump metal BUM2 may be in contact with the second electrode EL2 of the light emitting element LD, and the other end of the second bump metal BUM2 may be in contact with the second pad electrode PDE2. The other end of the second bump metal BUM2 may be in contact with two portions of the second pad electrode PDE2, which face (or oppose) each other, by the second through hole TH2 therebetween. In one or more embodiments, the second bump metal BUM2 may be introduced into the second through hole TH2 in the above-described bonding process. As shown in FIG. 10, the second bump metal BUM2 may be in contact with each of the second pad electrode PDE2 partially opened by the second through hole TH2 and the first power line PL1 partially opened by the second through hole TH2. In one or more embodiments, when the second bump metal BUM2 is introduced into the second through hole TH2 while being melted in the above-described bonding process, the second bump metal BUM2 may be partially filled in the second through hole TH2, to be in contact with each of the first pad electrode PDE2 and the first power line PL1, which are partially opened by the second through hole TH2.

In accordance with one or more of the above-described embodiments, each of the first and second through holes TH1 and TH2 may be used during monitoring for checking whether the light emitting element LD has been bonded. By way of example, an existence of a bump metal corresponding to each of the first and second through holes TH1 and TH2 and/or a phase change of the bump metal are observed with a human eye, using a microscope (e.g., an electron microscope), at the second surface SF2 of the substrate SUB, thereby checking whether the light emitting element LD has been bonded. Accordingly, whether a bonding failure of the light emitting element LD has occurred may be rapidly detected, thereby improving a product yield.

Also, in accordance with one or more of the above-described embodiments, the first bump metal BUM1 is in contact with the first pad electrode PDE1 partially opened by the first through hole TH1, and the second bump metal BUM2 is in contact with the second pad electrode PDE2 partially opened by the second through hole TH2, so that each of a contact area between the first bump metal BUM1 and the first pad electrode PDE1 and a contact area between the second bump metal BUM2 and the second pad electrode PDE2 may be reduced. Because the contact resistance of each of the first and second bump metals BUM1 and BUM2 is decreased, distortion caused by a signal delay occurring when a desired signal (e.g., a predetermined signal (or voltage)) is supplied to the light emitting element LD is reduced or minimized, so that the light emitting element LD may be more stably driven. Accordingly, the reliability of the display device (see "DD" shown in FIG. 1) may be improved.

FIGS. 11-20 are cross-schematic sectional views sequentially illustrating a manufacturing method of the pixel PXL shown in FIG. 9.

Hereinafter, a manufacturing method of the pixel PXL shown in FIG. 9 in accordance with one or more embodiments of the present disclosure will be sequentially described with reference to FIGS. 11-20.

In this specification, it is described that manufacturing steps of the pixel PXL are sequentially performed according to the sectional views. However, it will be apparent that each step of the sectional views may be changed without departing from the scope of the present disclosure. For example, the order of the steps may be changed, some steps may be omitted, or another step may be further included between the steps.

In FIGS. 11-20, portions different from those of the above-described one or more embodiments will be mainly described to avoid redundancy.

Referring to FIGS. 7-9 and 11, a first conductive layer is locally formed on a first surface SF1 of a substrate SUB. The first conductive layer may be made of a conductive material (or substance) such as molybdenum (Mo), but the present disclosure is not limited thereto. The first conductive layer may include a bottom metal layer BML. The bottom metal layer BML may be located on the first surface SF1 of the substrate SUB to overlap first and second transistors T1 and T2 in the third direction DR3.

Referring to FIGS. 7-9, 11, and 12, a buffer layer BFL is entirely formed on the bottom metal layer BML and the first surface SF1 of the substrate SUB. The buffer layer BFL may be an inorganic insulating layer including an inorganic material. In one or more embodiments, the buffer layer BFL may be made of silicon oxide ($SiO_x$).

Referring to FIGS. 7-9 and 11-13, a semiconductor pattern SCP is locally formed on the buffer layer BFL.

The semiconductor pattern SCP may be made of silicon (Si), i.e., amorphous silicon, or be made of poly-silicon. When the semiconductor pattern SCP is made of amorphous silicon, a crystallization process may be further performed using laser, etc. In one or more embodiments, the semiconductor pattern SCP may be made of a semiconductor oxide including a two component-based compound ($AB_x$), a three component-based compound ($AB_xC_y$), and a four component-based compound ($AB_xC_yD_z$), which contain indium (In), zinc (Zn), gallium (Ga), tin (Sn), titanium (Ti), aluminum (Al), hafnium (Hf), zirconium (Zr), magnesium (Mg), etc., which may be used solely or as a combination thereof.

Referring to FIGS. 7-9 and 11-14, a gate insulating layer GI is locally formed on each of the semiconductor pattern SCP and the buffer layer BFL. The gate insulating layer GI may overlap a portion of each of the semiconductor pattern SCP and the buffer layer BFL in the third direction DR3. In one or more embodiments, the gate insulating layer GI may be locally formed on the semiconductor pattern SCP and the buffer layer BFL to correspond to a second conductive layer to be formed in a subsequent process.

The gate insulating layer GI may be an inorganic insulating layer including an inorganic material. In one or more embodiments, the gate insulating layer GI may be made of silicon oxide ($SiO_x$).

Referring to FIGS. 7-9 and 11-15, the second conductive layer is formed on the gate insulating layer GI. The second conductive layer may be made of a conductive material (or substance) such as molybdenum (Mo), but the present disclosure is not limited thereto. The second conductive layer may include a first gate electrode GE1, a second gate electrode GE2, a scan line Si, and a first storage electrode STE1 (or second power line PL2).

The first gate electrode GE1 may be located on the gate insulating layer GI to overlap a portion of one semiconductor pattern SCP in the third direction DR3. One region of the semiconductor pattern SCP, which overlaps the first gate electrode GE1, may become a first active pattern ACT1 (or channel region). Other regions of the semiconductor pattern SCP, which do not overlap the first gate electrode GE1, may become a first source region SE1 and a first drain region DE1. The first gate electrode GE1, the first active pattern ACT1, the first source region SE1, and the first drain region DE1, which are described above, may constitute the first transistor T1.

The second gate electrode GE2 may be located on the gate insulating layer GI to overlap a portion of another semiconductor pattern SCP in the third direction DR3. One region of the semiconductor pattern SCP, which overlaps the second gate electrode GE2, may become a second active pattern ACT2 (or channel region). Other regions of the semiconductor pattern SCP, which do not overlap the second gate electrode GE2, may become a second source region SE2 and a second drain region DE2. The second gate electrode GE2, the second active pattern ACT2, the second source region SE2, and the second drain region DE2, which are described above, may constitute the second transistor T2.

Referring to FIGS. 7-9 and 11-16, an interlayer insulating layer ILD including a plurality of contact holes CH exposing portions of the first and second source regions SE1 and SE2, the first and second drain regions DE1 and DE2, and the first storage electrode STE1 is formed on the second conductive layer.

The interlayer insulating layer ILD may be an inorganic insulating layer including an inorganic material. In one or more embodiments, the interlayer insulating layer ILD may be made of silicon oxide ($SiO_x$).

Referring to FIGS. 7-9 and 11-17, a third conductive layer is formed on the interlayer insulating layer ILD. The third conductive layer may be made of a conductive material (or substance) such as molybdenum (Mo), but the present disclosure is not limited thereto. The third conductive layer may include first and second connection lines CNL1 and CNL2, a first power line PL1, a data line Dj, and a second storage electrode STE2 (or conductive pattern CP).

The first connection line CNL1 may be electrically connected to the first drain region DE1 through a contact hole CH penetrating the interlayer insulating layer ILD.

The second connection line CNL2 may be electrically connected to the first source region SE1 through a contact hole CH penetrating the interlayer insulating layer ILD. Also, the second connection line CNL2 may be electrically connected to the first storage electrode STE1 (or the second power line PL2) through another contact hole CH penetrating the interlayer insulating layer ILD.

The data line Dj may be electrically connected to the second drain region DE2 through a contact hole penetrating the interlayer insulating layer ILD.

The second storage electrode STE2 (or the conductive pattern CP) may be electrically connected to the first gate electrode GE1 through a contact hole CH penetrating the interlayer insulating layer ILD (for example, see FIG. 7).

A second through hole TH2 may be formed by removing one region of the first power line PL during the process of forming the third conductive layer. In addition, a first through hole TH1 may be formed by removing one region of the first connection line CNL1 during the process of forming the third conductive layer.

In one or more embodiments, the second through hole TH2 may be formed by removing one region of the first power line PL1 in the process of forming the first power line PL1.

The first through hole TH1 may be formed by removing one region of the first connection line CNL1 in the process of forming the first connection line CNL1.

Due to the first and second through holes TH1 and TH2, each of the first power line PL1 and the first connection line CNL1 may be partially opened.

Referring to FIGS. 7-9 and 11-18, a first passivation layer PSV1 is formed on the third conductive layer. The first passivation layer PSV1 may be partially opened to expose the first connection line CNL1 partially opened by the first through hole TH1 and the first power line PL1 partially opened by the second through hole TH2. The first passivation layer PSV1 may be an inorganic insulating layer including an inorganic material. In one or more embodiments, the first passivation layer PSV1 may be provided as a double layer in which silicon oxide ($SiO_x$) and silicon nitride ($SiN_x$) are sequentially stacked.

Referring to FIGS. 7-9 and 11-19, a fourth conductive layer is formed on the first passivation layer PSV1. The fourth conductive layer may include a first pad electrode PDE1 and a second pad electrode PDE2. The fourth conductive layer may be provided in a double layer in which molybdenum (Mo) and gold (Au) are sequentially stacked, but the present disclosure is not limited thereto.

The first pad electrode PDE1 may be provided on the first passivation layer PSV1 to overlap the exposed first connection line CNL1 in the third direction DR3. The first pad electrode PDE1 may be electrically connected to the exposed first connection line CNL1.

The second pad electrode PDE2 may be provided on the first passivation layer PSV1 to overlap the exposed first power line PL1. The second pad electrode PDE2 may be electrically connected to the exposed first power line PL1.

One region of each of the first pad electrode PDE1 and the second pad electrode PDE2 may be removed in the process of forming the fourth conductive layer. The one region removed in the first pad electrode PDE1 may correspond to the first through hole TH1. The one region removed in the second pad electrode PDE2 may correspond to the second through hole TH2. Therefore, the first through hole TH1 may be finally formed while penetrating one region of each of the first pad electrode PDE1 and the first connection line CNL1. In addition, the second through hole TH2 may be finally formed while penetrating one region of each of the second pad electrode PDE2 and the first power line PL1.

Referring to FIGS. 7-9 and 11-20, a second passivation layer PSV2 is formed on the fourth conductive layer. The second passivation layer PSV2 may include a first contact part CNT1 exposing one region of the first pad electrode PDE1 and a second contact part CNT2 exposing one region of the second pad electrode PDE2. In one or more embodiments, the second passivation layer PSV2 may be an organic insulating layer including an organic material.

Continuously, a transfer base 1 having a light emitting element LD transferred thereto is disposed at a desired position (e.g., a predetermined position) in the pixel PXL. In one or more embodiments, the transfer base 1 having the light emitting element LD transferred thereto is disposed in the pixel PXL such that the first and second bump metals BUM1 and BUM2 connected to the light emitting element LD face the first and second electrodes PDE1 and PDE2.

The light emitting element LD may include a semiconductor structure LD', a first electrode EL1, and a second electrode EL2. The semiconductor structure LD' may include a first semiconductor layer 11, an active layer 12, and a second semiconductor layer 13.

In one or more embodiments, the semiconductor structure LD' may further include an insulative film 14 covering an outer surface (e.g., an outer peripheral surface) of each of the first semiconductor layer 11, the active layer 12, and the second semiconductor layer 13, which is exposed through mesa etching. The insulative film 14 may prevent an electrical short circuit which may occur when the active layer 12 contact a conductive material other than the first and second semiconductor layers 11 and 13. The insulative film 14 may include a transparent insulating material. For example, the insulative film 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium-strontium oxide ($SrTiO_x$), cobalt oxide ($Co_xO_y$), magnesium oxide (MgO), zinc oxide (ZnO), ruthenium oxide ($RuO_x$), nickel oxide (NiO), tungsten oxide ($WO_x$), tantalum oxide ($TnO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the present disclosure is not limited thereto, and various materials having insulating properties may be used as the material of the insulative film 14.

The insulative film 14 may be provided in the form of a single layer or be provided in the form of a multi-layer including at least two layers. In one or more embodiments, when the protective film 16 may be configured as a double layer including a first layer and a second layer, which are sequentially stacked, the first layer and the second layer may be made of different materials (or ingredients), and be formed through different processes. In one or more embodiments, the first layer and the second layers may be formed of the same material through a continuous process.

The transfer base 1 may be a light transmissive substrate including sapphire ($Al_2O_3$), glass, polyimide, etc. Accordingly, the transfer base 1 enables laser light irradiated onto the top and/or the bottom thereof to be transmitted therethrough. A sacrificial layer may be provided on the transfer base 1. The light emitting element LD may be formed on the sacrificial layer of the transfer base 1. The sacrificial layer may include materials easily exfoliated by laser irradiated thereonto, which are selected from materials having adhesive properties (or cohesive properties). When the laser is irradiated onto the top of the transfer base 1, the sacrificial layer and the light emitting element LD may be physically separated from each other. In one or more embodiments, the sacrificial layer may lose an adhesion function when the laser is irradiated.

After the laser is irradiated, the transfer base 1 may be separated from the light emitting element LD. The first bump metal BUM1 connected to the first electrode EL1 of the light emitting element LD may be in contact with the first pad electrode PDE1, and the second bump metal BUM2 connected to the second electrode EL2 of the light emitting element LD may be in contact with the second pad electrode PDE2. The first bump metal BUM1 and the first pad electrode PDE1 may not be electrically connected to each other, and the second bump metal BUM2 and the second pad electrode PDE2 may not be electrically connected to each other.

Afterwards, by performing a bonding process through a TC bonding method, the first bump metal BUM1 and the first pad electrode PDE1 are bonded to each other, and the second bump metal BUM2 and the second pad electrode PDE2 are bonded to each other, so that the pixel circuit (see "PXC" shown in FIG. 5) of the pixel PXL and the light emitting element LD are electrically connected to each other. The first bump metal BUM1 may correspond to the first through hole TH1, and the second bump metal BUM2 may correspond to the second through hole TH2.

Each of the first and second through holes TH1 and TH2 is used as a monitoring means for checking whether the light emitting element LD has been bonded. Thus, whether the light emitting element LD has been bonded may be checked by observing whether the first and second bump metals BUM1 and BUM2 corresponding to the first and second through holes TH1 and TH2 exist and a phase change of the first and second bump metals BUM1 and BUM2 through the second surface SF2 (or rear surface) of the substrate SUB.

Figure 21:
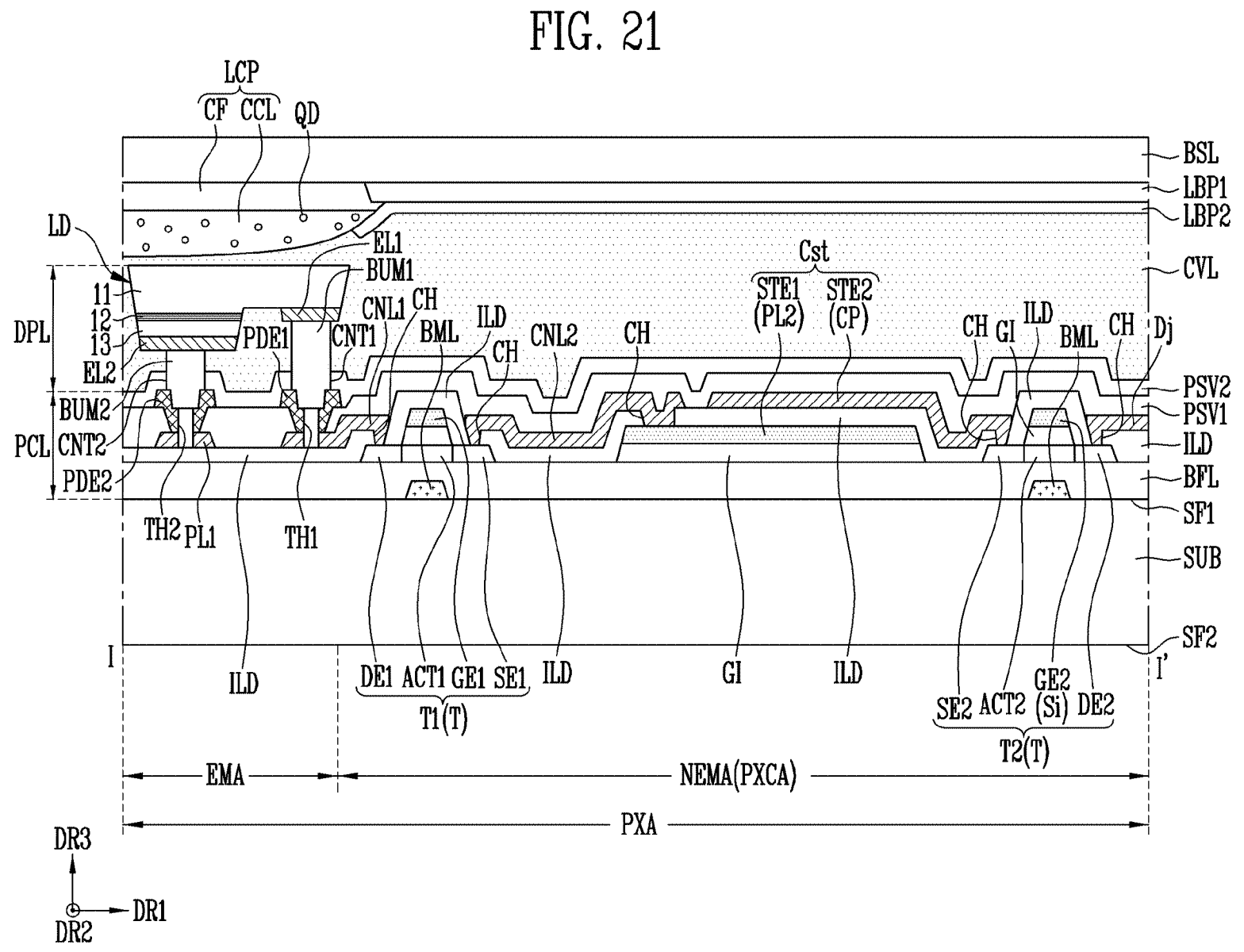
Figure 22:
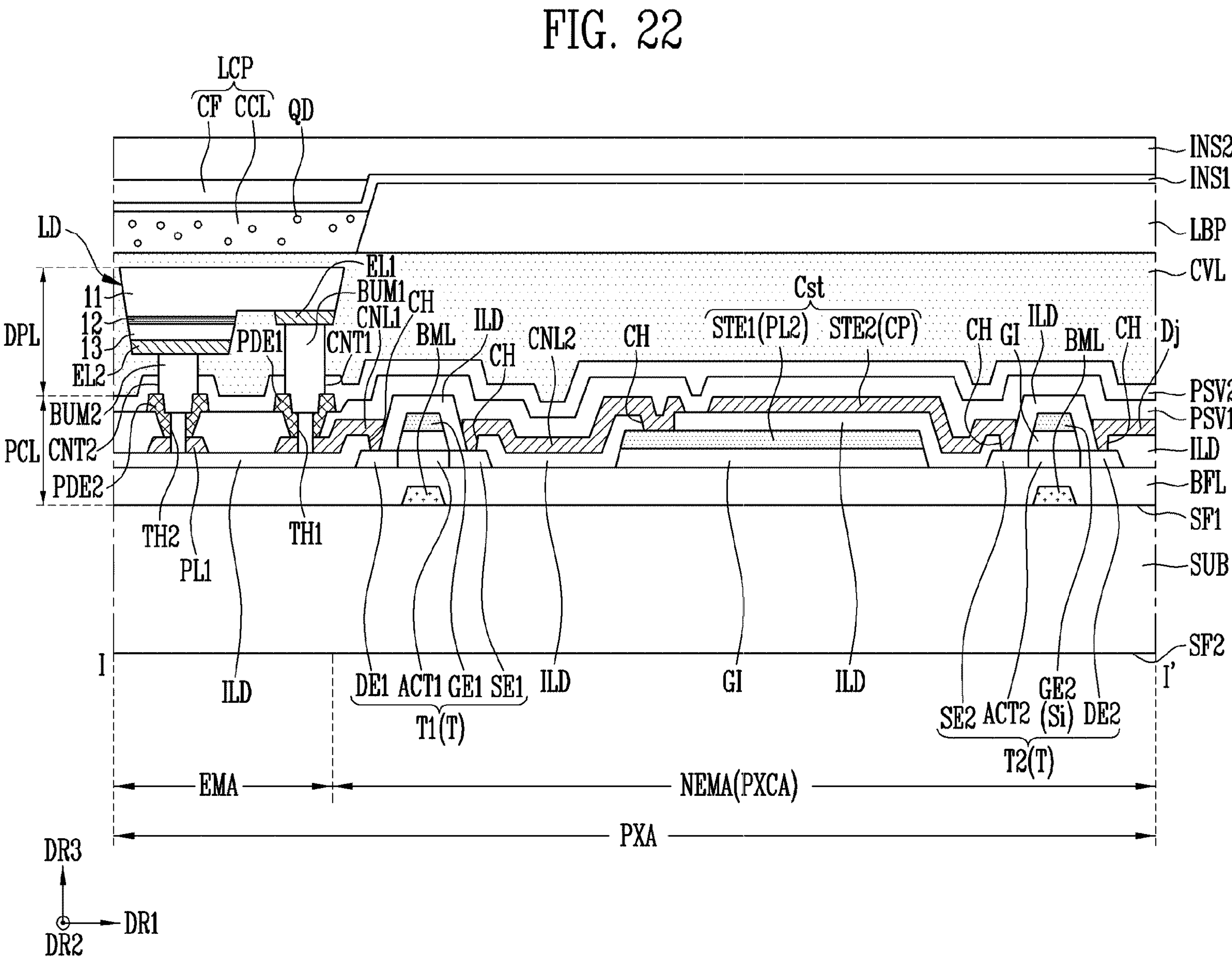

FIGS. 21 and 22 schematically illustrate a pixel PXL in accordance with one or more embodiments of the present disclosure, and are cross-sectional views corresponding to the line I-I' shown in FIG. 7.

The pixel PXL shown in each of FIGS. 21 and 22 may be configured substantially identical or similar to the pixel PXL shown in FIG. 9, except that an upper substrate is disposed on a cover layer CVL covering the light emitting element LD.

One or more embodiments according to FIGS. 21 and 22 represent different embodiments in relation to the position, formation order, and/or shape of a light conversion pattern LCP.

Accordingly, in FIGS. 21 and 22, portions different from those of the above-described embodiments will be mainly described to avoid redundancy.

First, referring to FIGS. 7, 9, and 21, an upper substrate may be disposed over the light emitting element LD.

The upper substrate may be provided on the display element layer DPL of the pixel PXL to cover the pixel area PXA. The upper substrate may be the window (see "WD" shown in FIG. 2) of the display device (see "DD" shown in FIG. 2). A cover layer CVL may be provided between the upper substrate and the light emitting element LD.

The cover layer CVL may entirely cover the emission area EMA in which the light emitting element LD is located and the pixel circuit area PXCA in which the pixel circuit PXC is located, to block moisture or humidity from being introduced to the light emitting element LD from the outside. The cover layer CVL may have a structure in which at least one inorganic insulating layer or at least one organic insulating layer are alternately stacked.

In one or more embodiments, a transparent adhesive layer (or cohesive layer), e.g., an optically clear adhesive (OCA) for reinforcing adhesion between the light emitting element LD and the upper substrate may be used, but the present disclosure is not limited thereto. In one or more embodiments, the cover layer CVL may be a refractive index conversion layer for improving light emission luminance of the pixel PXL by converting the refractive index of light that is emitted from light emitting elements LD and then advances toward the upper substrate. In one or more embodiments, the cover layer CVL may be made of a thermosetting resin and/or a photocurable resin, to be coated in a liquid form on the substrate SUB and then cured through a curing process using heat and/or light. The cover layer CVL may protect the light emitting element and more stably fix the light emitting element.

The upper substrate may be located on the cover layer CVL.

The upper substrate may include a base layer BSL and a light conversion pattern LCP.

The base layer BSL may be a rigid substrate or a flexible substrate, and the material or property of the base layer BSL is not particularly limited. The base layer BSL may be made of the same material as the substrate SUB, or be made of a material different from that of the substrate SUB.

The light conversion pattern LCP may be disposed on one surface of the base layer BSL to face a corresponding pixel PXL. The light conversion pattern LCP may include a color conversion layer CCL and a color filter CF, which correspond to a desired color (e.g., a predetermined color).

The color conversion layer CCL may include color conversion particles QD corresponding to a specific color. The color filter may allow light of the specific color to be selectively transmitted therethrough.

The color conversion layer CCL is disposed on the one surface of the base layer BSL to face a light emitting element LD, and include color conversion particles QD for converting light emitted from the light emitting element LD into light of a specific color. In one or more embodiments, when the pixel PXL is a red pixel, the color conversion layer CCL may include color conversion particles QD of a red quantum dot for converting light (or light of a first color) emitted from the light emitting element LD into light of red (or light of a second color). In addition, when the one pixel PXL is a green pixel, the color conversion layer CCL may include color conversion particles QD of a green quantum dot for converting light (or light of a first color) emitted from the light emitting elements LD into light of green (or light of a second color). Additionally, when the one pixel PXL is a blue pixel, the color conversion layer CCL may include color conversion particles QD of a blue quantum dot for converting light (or light of a first color) emitted from the light emitting elements LD into light of blue (or light of a second color). In one or more embodiments, the pixel PXL may include a light scattering layer including light scattering particles instead of the color conversion layer CCL including the color conversion particles QD. In one or more embodiments, when the light emitting element LD emits blue light, the pixel PXL may include a light scattering layer including light scattering particles. In one or more embodiments, the above-described light scattering layer may be omitted. In one or more embodiments, the pixel PXL may include transparent polymer instead of the color conversion layer CCL.

The color filter CF is disposed on one surface of the color conversion layer CCL of the pixel PXL, and may include a color filter material for allowing light of a specific color converted in the color conversion layer CCL to be selectively transmitted therethrough. When the pixel PXL is a red pixel, the color filter CF may include a red color filter. In addition, when the pixel PXL is a green pixel, the color filter CF may include a green color filter. In addition, when the pixel PXL is a blue pixel, the color filter CF may include a blue color filter.

The color conversion pattern LCP including the color conversion layer CCL and the color filter CF may be located in the emission area EMA of the pixel PXL.

A first light blocking pattern LBP1 may be located adjacent to the light conversion pattern LCP. The first light blocking pattern LBP1 may be provided on the one surface of the base layer BSL to overlap components located in the pixel circuit area PXCA (or the non-emission area NEMA), e.g., the pixel circuit PXC including the first and second transistors T1 and T2. The first light blocking pattern LBP1 may include at least one black matrix material (e.g., at least one light blocking material currently known in the art) among various kinds of black matrix materials, and/or a color filter material of a specific color.

In some embodiments, the first light blocking pattern LBP1 may be provided in the form of a multi-layer in which at least two color filters which allow lights of different colors to be selectively transmitted therethrough among a red color filter, a green color filter, and a blue color filter are overlap each other. In one or more embodiments, the first light blocking pattern LBP1 may be provided in a form including a red color filter, a green color filter which is located on the red color filter and overlaps the red color filter, and a blue color filter which is located on the green color filter and overlaps the green color filter. That is, the first light blocking pattern LBP1 may be provided in the form of a structure in which a red color filter, a green color filter, and a blue color filter are sequentially stacked. The red color filter, the green color filter, and the blue color filter may be used as the first light blocking pattern LBP1 which blocks transmission of light in the non-emission area NEMA of the pixel area PXA.

In one or more embodiments, a second light blocking pattern LBP2 may be disposed on the first light blocking pattern LBP1. The first light blocking pattern LBP1 and the second light blocking pattern LBP2 may include the same material. In one or more embodiments, the first light blocking pattern LBP1 and the second light blocking pattern LBP2 may be a black matrix.

Next, referring to FIGS. 8, 9, and 22, a light blocking pattern LBP may be provided on the cover layer CVL.

The light blocking pattern LBP may include a light blocking material that prevents a light leakage failure in which light (or ray) is leaked between the pixel PXL and pixels adjacent thereto. The light blocking pattern LBP may be a black matrix. The light blocking pattern LBP may prevent mixture of lights emitted from the respective adjacent pixels. In one or more embodiments, the light blocking pattern LBP may include at least one light blocking material and/or at least one reflective material, to allow light emitted from a light emitting element LD located in the emission area EMA to further advance in the image display direction of the display device (see "DD" shown in FIG. 1, thereby improving the light emission efficiency of the light emitting element LD.

The above-described light blocking pattern LBP may be provided in the non-emission area NEMA (or the pixel circuit area PXCA) except the emission area EMA. The light blocking pattern LBP may be a dam structure which is located on the cover layer CVL, to finally define the emission area EMA in which a color conversion layer CCL is to be positioned (or input). By way of example, the emission area EMA of the pixel PXL may be finally defined by the light blocking pattern LBP, so that the color conversion layer CCL including a desired amount and/or a desired kind of color conversion particles QD may be placed (or input).

The color conversion layer CCL may be provided in a form filling a space surrounded by the light blocking pattern LBP.

A first insulating layer INS1 may be entirely provided and/or formed on the color conversion layer CCL and the light blocking pattern LBP.

The first insulating layer INS1 may be a protective layer covering components located thereunder, e.g., the color conversion layer CCL and the light blocking pattern LBP. The first insulating layer INS1 may be an inorganic insulating layer including an inorganic material or an organic insulating layer including an organic material, but the material of the first insulating layer INS1 is not limited to the above-described embodiments. In one or more embodiments, the first insulating layer INS1 may be omitted.

A color filter CF may be provided on one surface of the first insulating layer INS1 to overlap (or correspond to) the color conversion layer CCL. The color filter CF may be located on the color conversion layer CCL with the first insulating layer INS1 interposed therebetween, to allow light of a specific color converted in the color conversion layer CCL to be selectively transmitted in the image display direction of the display device DD therethrough.

The second insulating layer INS2 may be entirely provided and/or formed on the color filter CF and the first insulating layer INS1. The second insulating layer INS2 may be an inorganic insulating layer including an inorganic material or an organic insulating layer including an organic material. In one or more embodiments, the second insulating layer INS2 may be a planarization layer that reduces a step difference caused by components disposed thereunder.

As described above, in the display device DD in accordance with one or more embodiments of the present disclosure, the light conversion pattern LCP is disposed on the light emitting element LD, so that light having excellent color reproduction is emitted through the light conversion pattern LCP, thereby improving light emission efficiency.

Figure 23:
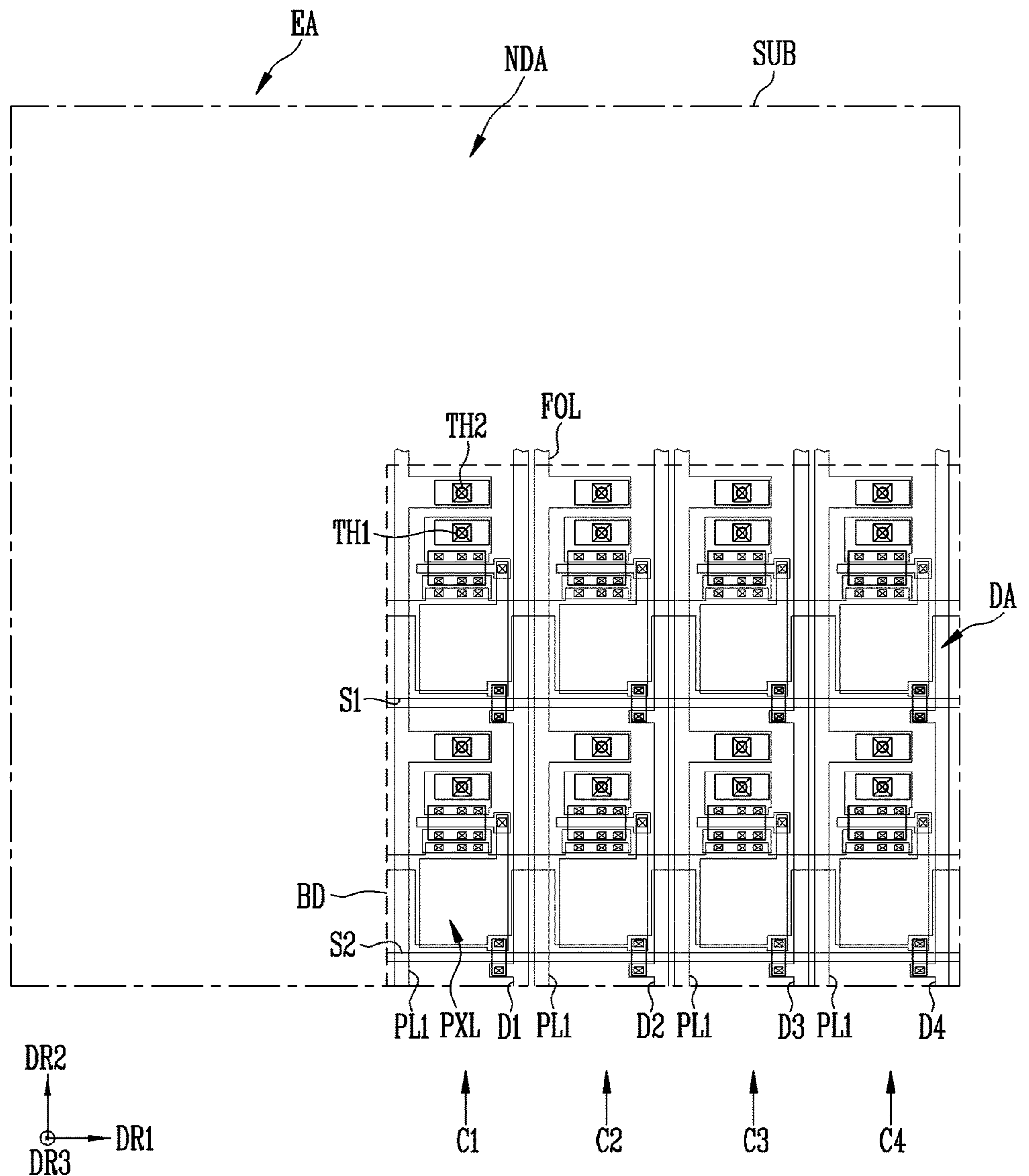
FIGS. 23-25 are schematic enlarged plan views of portion EA shown in FIG. 3.
Figure 24:
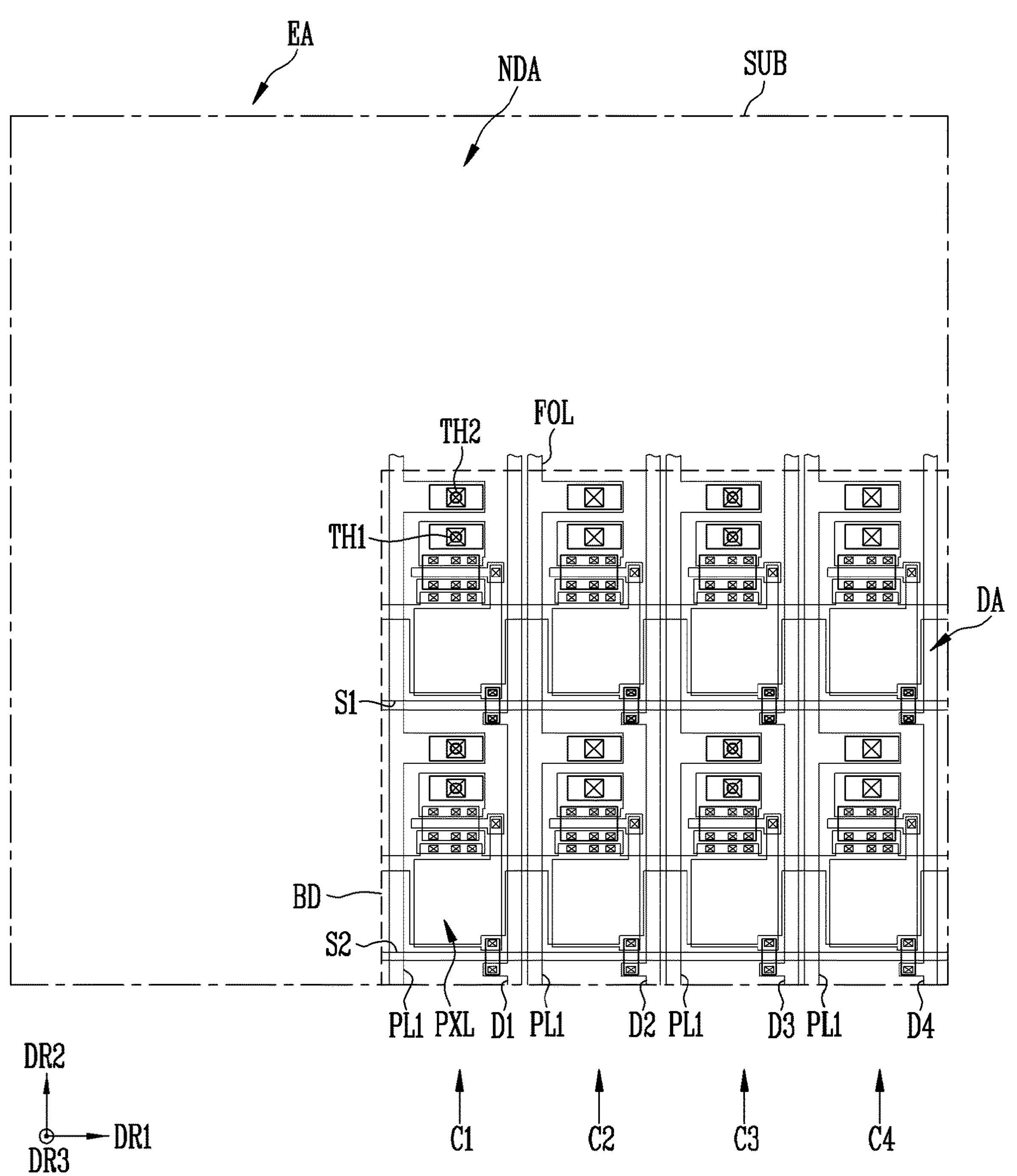
Figure 25:
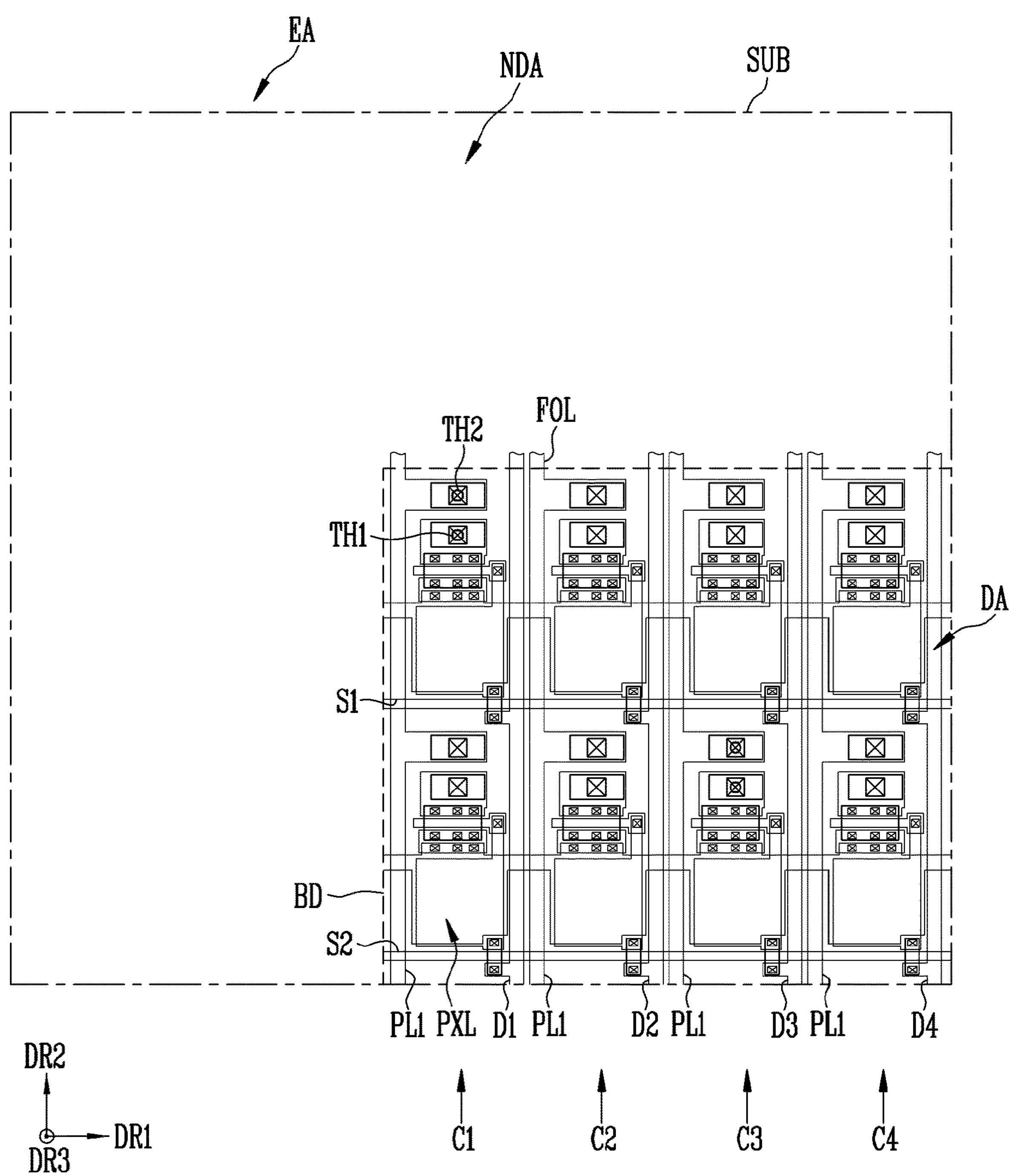

FIGS. 23-25 are schematic enlarged plan views of portion EA shown in FIG. 3.

One or more embodiments shown in FIGS. 23-25 represent different embodiments in relation to positions of first and second through holes TH1 and TH2. The first and second through holes TH1 and TH2 may be disposed at various positions.

In FIGS. 23-25, portions different from the above-described embodiments will be mainly described to avoid redundancy.

Referring to FIGS. 3 and 23-25, the substrate SUB may include a display area DA and a non-display area NDA. A plurality of pixels PXL may be disposed in the display area DA.

The pixels PXL may be arranged in a matrix form along rows extending in the first direction DR1 and columns extending in the second direction DR2. However, the arrangement form of the pixels PXL is not particularly limited, and the pixels PXL may be arranged in other form. Each of the pixels PXL may be the pixel PXL described with reference to FIG. 7.

First to fourth pixel columns C1, C2, C3, and C4 may be provided in the display area DA.

Pixels PXL that are arranged along the second direction DR2 and are commonly connected to a first data line D1 may be located on the first pixel column C1. The pixels PXL located on the first pixel column C1 may include one pixel PXL located in an area in which a first scan line S1 and the first data line D1 cross each other and one pixel PXL located in an area in which a second scan line S2 and the first data line D1 cross each other. The first data line D1 may be electrically and physically connected to a corresponding fan-out line FOL. The fan-out line FOL may be located in the non-display area NDA.

Pixels PXL that are arranged along the second direction DR2 and are commonly connected to a second data line D2 may be located on the second pixel column C2. The pixels PXL located on the second pixel column C2 may include one pixel PXL located in an area in which the first scan line S1 and the second data line D2 cross each other and one pixel PXL located in an area in which the second scan line S2 and the second data line D2 cross each other. The second data line D2 may be electrically and physically connected to a corresponding fan-out line FOL. The fan-out line FOL may be located in the non-display area NDA.

Pixels PXL that are arranged along the second direction DR2 and are commonly connected to a third data line D3 may be located on the third pixel column C3. The pixels PXL located on the third pixel column C3 may include one pixel PXL located in an area in which the first scan line S1 and the third data line D3 cross each other and one pixel PXL located in an area in which the second scan line S2 and the third data line D3 cross each other. The third data line D3 may be electrically and physically connected to a corresponding fan-out line FOL. The fan-out line FOL may be located in the non-display area NDA.

Pixels PXL that are arranged along the second direction DR2 and are commonly connected to a fourth data line D4 may be located on the fourth pixel column C4. The pixels PXL located on the fourth pixel column C4 may include one pixel PXL located in an area in which the first scan line S1 and the fourth data line D4 cross each other and one pixel PXL located in an area in which the second scan line S2 and the fourth data line D4 cross each other. The fourth data line D4 may be electrically and physically connected to a corresponding fan-out line FOL. The fan-out line FOL may be located in the non-display area NDA.

Each of the pixels PXL located on the first pixel column C1, the pixels PXL located on the second pixel column C2, the pixels PXL located on the third pixel column C3, and the pixels PXL located on the fourth pixel column C4 may include an emission area and a non-emission area.

In one or more embodiments, the first and second through holes TH1 and TH2 as a monitoring means that may check whether the light emitting element (see "LD" shown in FIG. 9) has been bonded may be provided in the pixels PXL. For example, as shown in FIG. 23, the first and second through holes TH1 and TH2 may be located in the emission area of each of the pixels PXL located on the first pixel column C1, the pixels PXL located on the second pixel column C2, the pixels PXL located on the third pixel column C3, and the pixels PXL located on the fourth pixel column C4. That is, each of the pixels PXL located in the display area DA may include the first through hole TH1 and the second through hole TH2.

However, the present disclosure is not limited thereto. In one or more embodiments, the first and second through holes TH1 and TH2 may be provided in some of the pixels PXL located in the display area DA. In one or more embodiments, as shown in FIG. 24, the first and second through holes TH1 and TH2 may be provided in pixels PXL located on odd-numbered columns with respect to a boundary BD between the display area DA and the non-display area NDA along the first direction DR1. In other words, the first and second through holes TH1 and TH2 may be located in the emission area of each of the pixels PXL located on the first pixel column C1 and the pixels PXL located on the third pixel column C3. In one or more embodiments, the first and second through holes TH1 and TH2 may be provided in pixels PXL located on even-numbered columns with respect to the boundary BD between the display area DA and the non-display area NDA along the first direction DR1. In other words, the first and second through holes TH1 and TH2 may be located in the emission area of each of the pixels PXL located on the second pixel column C2 and the pixels PXL located on the fourth pixel column C4.

In one or more embodiments, the first and second through holes TH1 and TH2 may be irregularly disposed in pixels PXL located in the display area DA. For example, as shown in FIG. 25, the first and second through holes TH1 and TH2 may be disposed in only some pixels PXL among the pixels PXL located in the display area DA. That is, the first and second through holes TH1 and TH2 may be randomly disposed in the display area DA.

In one or more embodiments, the first and second through holes TH1 and TH2 may be regularly located in the display area DA or may be irregularly located in the display area.

In the display device DD in accordance with the embodiment of the present disclosure, the first and second through holes TH1 and TH2 are disposed in all the pixels PXL provided in the display area DA or are disposed in only some pixels PXL provided in the display area DA, so that whether the light emitting element LD has been bonded may be easily checked through the rear surface of the substrate SUB, thereby rapidly detecting a bonding failure of the light emitting element LD.

Figure 26:
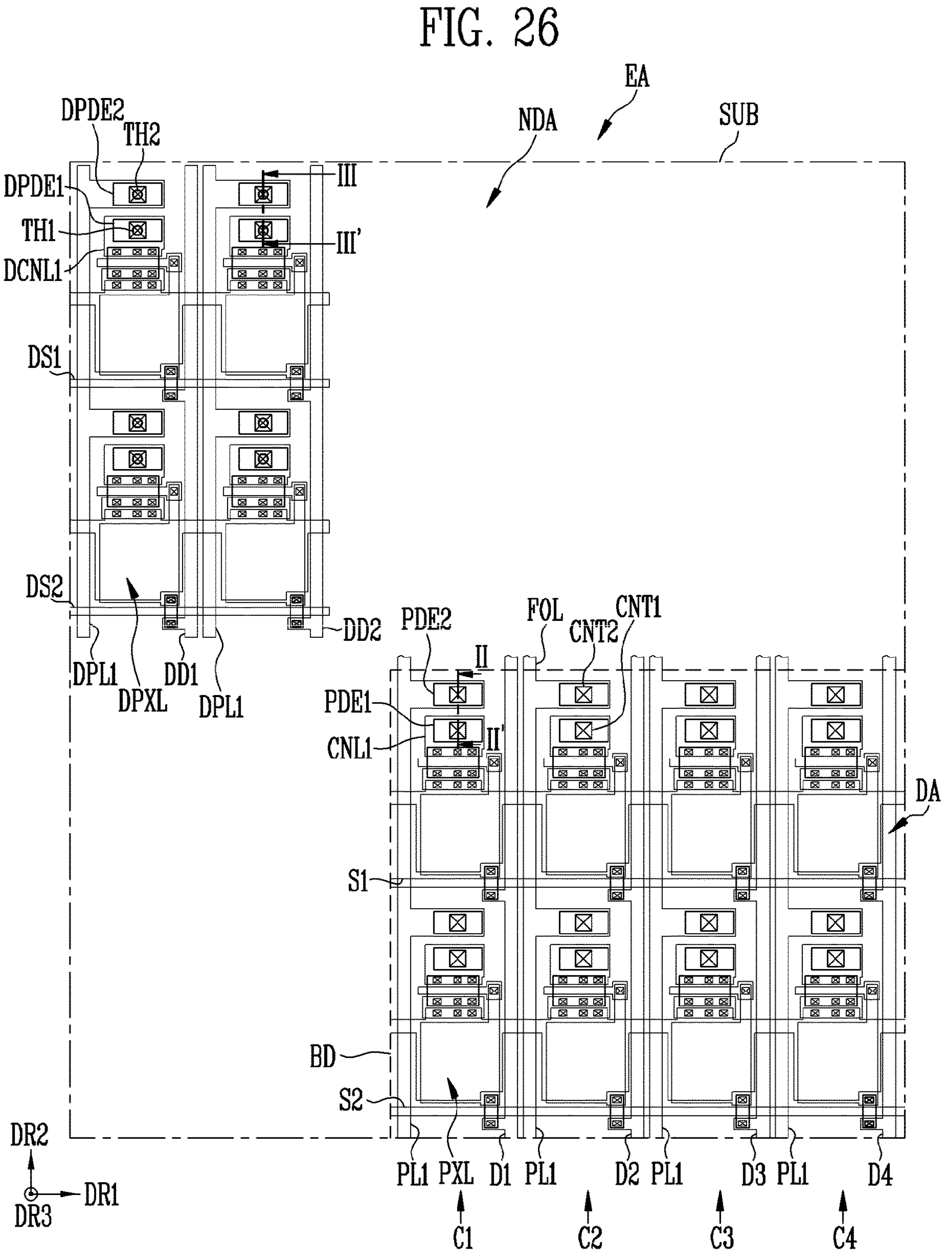
FIG. 26 is a schematic enlarged plan view of the portion EA shown in FIG. 3.
Figure 27:
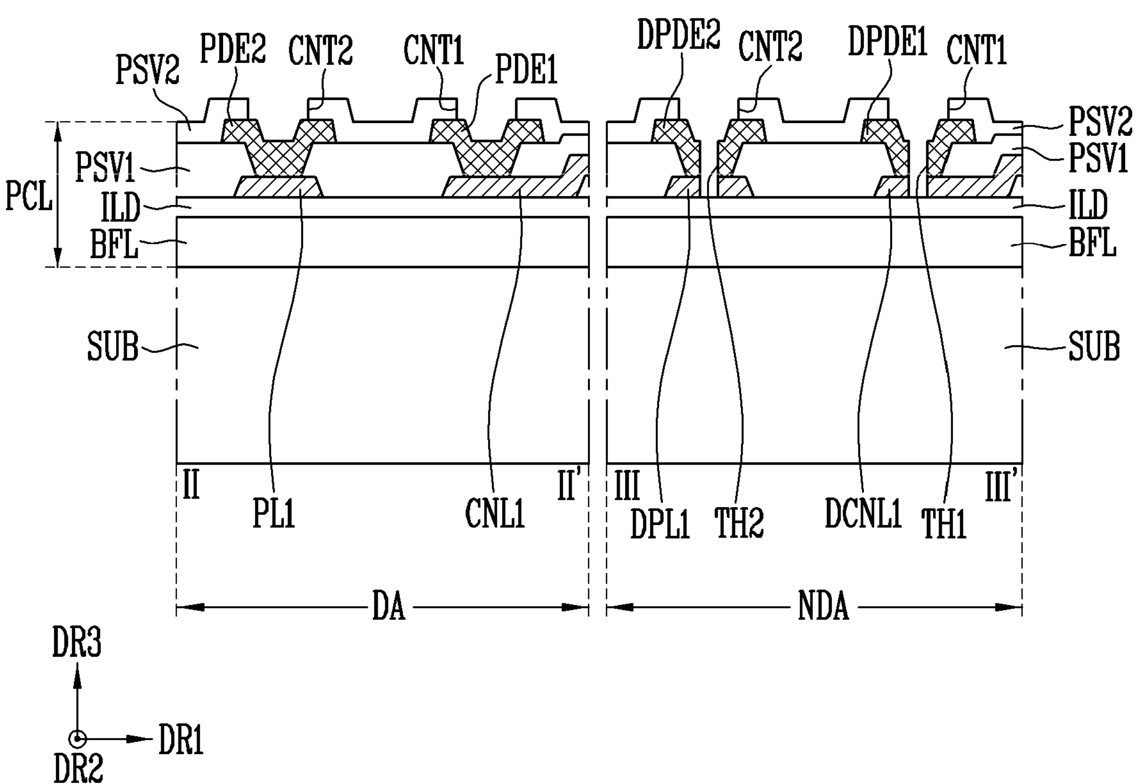
FIG. 27 is a cross-sectional view taken along the lines II-II' and III-III' shown in FIG. 26.
Figure 28:
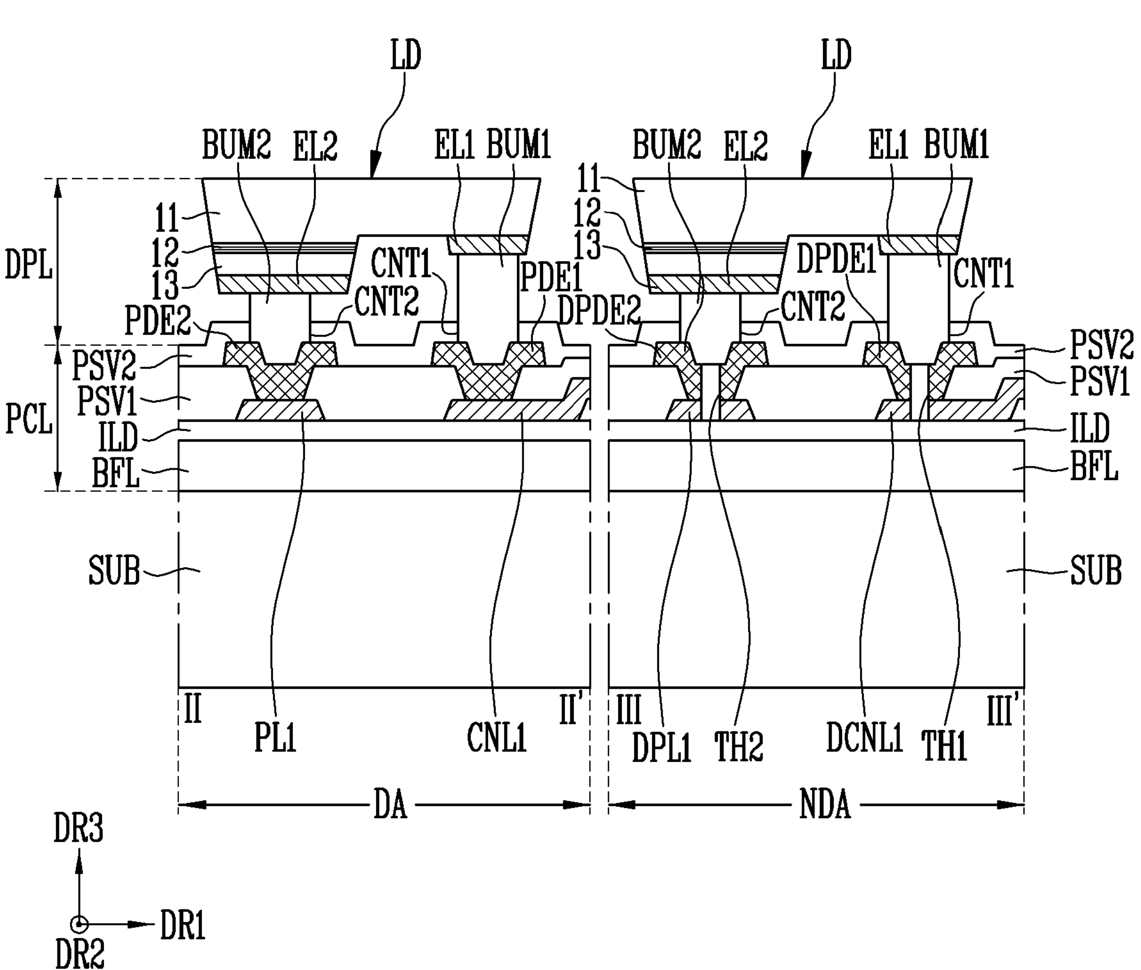
FIG. 28 schematically illustrates a dummy pixel and a pixel, which are bonded to a light emitting element, and is a cross-sectional view corresponding to the lines II-II' and III-III' shown in FIG. 26.

FIG. 26 is a schematic enlarged plan view of the portion EA shown in FIG. 3. FIG. 27 is a cross-sectional view taken along the lines II-II' and III-III' shown in FIG. 26. FIG. 28 schematically illustrates a dummy pixel DPXL and a pixel PXL, which are bonded to a light emitting element LD, and is a cross-sectional view corresponding to the lines II-II' and III-III' shown in FIG. 26.

In FIGS. 26-28, portions different from those of the above-described embodiment will be mainly described to avoid redundancy.

Referring to FIGS. 3 and 26-28, the substrate SUB may include a display area DA and a non-display area NDA.

A plurality of pixels PXL may be disposed in the display area DA, and at least one dummy pixel DPXL may be disposed in the non-display area NDA.

Each of the pixels PXL have the same structure as the pixel PXL described with reference to FIG. 7, and therefore, a detailed description of this will be omitted. Each of the pixels PXL may include a substrate SUB, a pixel circuit layer PCL, and a display element layer DPL. The pixel circuit layer PCL may include a pixel circuit (see "PXC" shown in FIG. 5), a first pad electrode PDE1, and a second pad electrode PDE2. The display element layer DPL may include a light emitting element LD (or first light emitting element) bonded to the first and second pad electrodes PDE1 and PDE2.

The dummy pixel DPXL may have a structure identical or substantially similar to that of the pixels PXL. In one or more embodiments, the pixels PXL and the dummy pixel DPXL may be electrically separated from each other. The dummy pixel DPXL may include a plurality of dummy pixels DPXL located in areas in which first and second dummy scan lines DS1 and DS2 and first and second dummy data lines DD1 and DD2 cross each other.

The first and second dummy scan lines DS1 and DS2 may be formed through the same process as first and second scan lines S1 and S2 located in the display area DA. The first and second dummy data lines DD1 and DD2 may be formed through the same process as first to fourth data lines D1, D2, D3, and D4 located in the display area DA. Each of the dummy pixels DPXL may include a first dummy power line DPL1. The first dummy power line DPL1 may be formed through the same process as a first power line PL1 located in the display area DA.

The first and second dummy scan lines DS1 and DS2, the first and second dummy data lines DD1 and DD2, and the first dummy power line DPL1, which are described above, may constitute a dummy signal line connected to the dummy pixels DPXL. The dummy signal line may be electrically separated from components to which a suitable signal (e.g., a predetermined signal (or voltage)) is applied from the outside, to maintain a floating state. The dummy signal line may be spaced from the pixels PXL located in the display area not to have influence on the pixels PXL.

Each of the dummy pixels DPXL may further include a first dummy connection line DCNL1, a first dummy pad electrode DPDE1, and a second dummy pad electrode DPDE2. The first dummy connection line DCNL1 may be formed through the same process as a first connection line CNL of each of the pixels PXL. The first and second dummy pad electrodes DPDE1 and DPDE2 may be formed through the same process as first and second pad electrodes PDE1 and PDE2 of each of the pixels PXL.

In one or more embodiments, first and second through holes TH1 and TH2 as a monitoring means capable of checking whether the light emitting element LD has been bonded may be provided in only the dummy pixels DPXL. The first and second through holes TH1 and TH2 may not be provided in the pixels PXL provided in the display area DA.

The first and second pad electrodes PDE1 and PDE2 of each of the pixels PXL may not be partially opened. In addition, a first connection line CNL1 located under the first pad electrode PDE1 and the first power line PL1 located under the second pad electrode PDE2 may also not partially opened.

In each of the dummy pixels DPXL, the first through hole TH1 may be provided while sequentially penetrating one area of each of the first dummy pad electrode DPDE1 and the first dummy connection line DCNL1. In each of the dummy pixels DPXL, the second through hole TH2 may be provided while sequentially penetrating one area of each of the second dummy pad electrode DPDE2 and the first dummy power line DPL1.

In one or more embodiments, the first and second through holes TH1 and TH2 may be formed to correspond to a position at which a light emitting element LD (or second light emitting element) is bonded in each of the dummy pixels DPXL. Whether the light emitting element LD (or second light emitting element) provided in each of the dummy pixels DPXL has been bonded is checked by using the first and second through holes TH1 and TH2 disposed in the dummy pixel DPXL, so that whether a light emitting element LD (or first light emitting element) provided in each of the pixels PXL has been bonded may be indirectly checked.

In accordance with one or more embodiments of the present disclosure, a through hole that penetrates a pad electrode and a substrate is provided, so that whether a bump metal bonded to the pad electrode exists and a phase change of the bump metal may be checked through the through hole. Accordingly, whether a light emitting element and a pixel circuit are bonded to each other may be easily checked.

Also, in accordance with one or more embodiments of the present disclosure, the contact area of the pad electrode and the bump metal is decreased, so that the contact resistance of the bump metal is not increased. Accordingly, there may be provided a display device and a manufacturing method thereto, which may improve the reliability of the display device by more stably driving the light emitting element.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
- a substrate including a display area and a non-display area; and
- a pixel located in the display area, the pixel having an emission area and a pixel circuit area,
- wherein the pixel comprises:
  - at least one transistor located in the pixel circuit area;
  - a first pad electrode and a second pad electrode spaced from each other and located in the emission area, the first pad electrode and the second pad electrode being electrically connected to the at least one transistor;
  - a first power line electrically connected to the second pad electrode;
  - a first through hole and a second through hole; and
  - a light emitting element located in the emission area, the light emitting element being electrically connected to the first pad electrode and the second pad electrode, the first through hole and the second through hole overlapping the light emitting element,
    - a first insulating layer, a second insulating layer, and a third insulating layer sequentially stacked on the substrate; and
  - a connection line between the third insulating layer and the first pad electrode, the connection line being electrically connected to the first pad electrode,
  - wherein the second through hole overlaps an active layer of the light emitting element, and
  - wherein the first through hole completely penetrates one region of the first pad electrode and the connection line and the second through hole completely penetrates one region of each of the second pad electrode and the first power line.

2. The display device of claim 1, wherein the light emitting element comprises:
- a semiconductor structure comprising a first semiconductor layer, the active layer on the first semiconductor layer, and a second semiconductor layer on the active layer;
- a first electrode located on the semiconductor structure, the first electrode being electrically connected to one of the first and second semiconductor layers; and
- a second electrode located on the semiconductor structure, the second electrode being electrically connected to an other one of the first and second semiconductor layers, the second electrode being spaced from the first electrode.

3. The display device of claim 2, further comprising:
- a first bump metal located between the first electrode and the first pad electrode, the first bump metal bonding the first pad electrode and the light emitting element to each other; and
- a second bump metal located between the second electrode and the second pad electrode, the second bump metal bonding the second pad electrode and the light emitting element to each other.

4. The display device of claim 3, wherein the first bump metal is in direct contact with the first pad electrode, and the second bump metal is in direct contact with the second pad electrode.

5. The display device of claim 3, wherein a width of each of the first and second bump metals is greater than that of each of the first and second through holes, respectively.

6. The display device of claim 5, wherein the first bump metal is partially located in the first through hole, and the second bump metal is partially located in the second through hole.

7. The display device of claim 3, wherein the pixel comprises a plurality of pixels, and wherein each of the plurality of pixels comprises the first and second through holes.

8. The display device of claim 3, wherein the pixel comprises a plurality of pixels, and wherein at least some of the plurality of pixels comprise the first and second through holes.

9. The display device of claim 8, wherein pixels located on odd-numbered columns with respect to a boundary between the display area and the non-display area among the plurality of pixels include the first and second through holes.

10. The display device of claim 3, further comprising:

the first power line between the third insulating layer and the second pad electrode;

a second power line on the second insulating layer, the second power line being electrically connected to the at least one transistor; and a conductive pattern on the third insulating layer.

11. The display device of claim 10, wherein one region of the connection line that corresponds to the first through hole, is removed in the emission area, and one region of the first power line that corresponds to the second through hole, is removed in the emission area.

12. The display device of claim 10, wherein the conductive pattern overlaps the second power line with the third insulating layer interposed therebetween, thereby constituting a storage capacitor.

13. The display device of claim 12, wherein the storage capacitor comprises:

a first storage electrode integrally formed with the second power line; and a second storage electrode integrally formed with the conductive pattern.

14. The display device of claim 3, wherein the pixel further comprises:

a light conversion pattern located above the light emitting element to correspond to the emission area; and a light blocking pattern located above the transistor to correspond to the pixel circuit area, the light blocking pattern being adjacent to the light conversion pattern.

15. The display device of claim 14, wherein the light conversion pattern comprises:

a color conversion layer converting light of a first color, which is emitted from the light emitting element, into light of a second color; and a color filter located above the color conversion layer, the color filter being configured to allow the light of the second color to be selectively transmitted therethrough.

16. The display device of claim 3, further comprising a cover layer located throughout the emission area and the pixel circuit area, the cover layer covering the light emitting element.

17. A display device comprising:

a substrate including a display area and a non-display area;

a pixel located in the display area, the pixel having an emission area and a pixel circuit area; and a dummy pixel located in the non-display area, the dummy pixel being spaced from the pixel, wherein the dummy pixel comprises:

a first dummy pad electrode and a second dummy pad electrode that are spaced from each other;

a first dummy power line;

a first through hole and a second through hole; and a first light emitting element comprising a first bump metal in contact with the first dummy pad electrode through the first through hole and a second bump metal in contact with the second dummy pad electrode through the second through hole, the first through hole and the second through hole overlapping the first light emitting element, a first insulating layer, a second insulating layer, and a third insulating layer sequentially stacked on the substrate; and a dummy connection line between the third insulating layer and the first dummy pad electrode, the dummy connection line being electrically connected to the first dummy pad electrode, wherein the second through hole overlaps an active layer of the first light emitting element, and wherein the first through hole completely penetrates one region of the first dummy pad electrode and the dummy connection line and the second through hole completely penetrates one region of each of the second dummy pad electrode and the first dummy power line.

18. The display device of claim 17, wherein the pixel comprises:

at least one transistor located in the pixel circuit area;

a first pad electrode and a second pad electrode spaced from each other and located in the emission area, the first pad electrode and the second pad electrode being electrically connected to the at least one transistor;

an insulating layer located on the first and second pad electrodes, the insulating layer being partially opened to expose a portion of the first pad electrode and a portion of the second pad electrode; and a second light emitting element located in the emission area, the second light emitting element being in contact with the exposed first pad electrode, the second light emitting element being in contact with the exposed second pad electrode.

19. An electronic device comprising the display device of claim 1.

* * * * *